United States Patent
Nguyen et al.

(10) Patent No.: US 12,068,725 B2
(45) Date of Patent: *Aug. 20, 2024

(54) SWITCHED CAPACITOR MODULATOR

(71) Applicant: MKS Instruments, Inc., Andover, MA (US)

(72) Inventors: Duy Nguyen, Daejeon (KR); Albert Kuramshin, Daejeon (KR); Aaron Radomski, Conesus, NY (US); Alexander Jurkov, Calgary (CA); Hangon Kim, Daejeon (KR); Kelvin Lee, Daejeon (KR)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,498

(22) Filed: Nov. 23, 2022

(65) Prior Publication Data
US 2023/0087716 A1 Mar. 23, 2023

Related U.S. Application Data

(63) Continuation of application No. 17/111,700, filed on Dec. 4, 2020, now Pat. No. 11,545,943.

(51) Int. Cl.
*H03F 1/30* (2006.01)
*H03F 1/02* (2006.01)
(Continued)

(52) U.S. Cl.
CPC .......... *H03F 3/245* (2013.01); *H03F 1/0227* (2013.01); *H03F 1/565* (2013.01); *H03F 3/005* (2013.01);
(Continued)

(58) Field of Classification Search
CPC ........................................................ H03F 1/30
(Continued)

(56) References Cited

U.S. PATENT DOCUMENTS 6,038,143 A * 3/2000 Miyazaki ............ H02M 3/3385
363/19
7,602,127 B2 10/2009 Coumou
(Continued)

FOREIGN PATENT DOCUMENTS

CN 103124067 B 4/2017
CN 106787832 A 5/2017
(Continued)

OTHER PUBLICATIONS

Taiwanese Office Action regarding Application No. 110138241, mailed Mar. 25, 2023.
(Continued)

*Primary Examiner* — Henry Choe
(74) *Attorney, Agent, or Firm* — Harness, Dickey & Pierce, P.L.C.

(57) ABSTRACT

A switched capacitor modulator (SCM) includes a RF power amplifier. The RF power amplifier receives a rectified voltage and a RF drive signal and modulates an input signal in accordance with the rectified voltage to generate a RF output signal to an output terminal. A reactance in parallel with the output terminal is configured to vary in response to a control signal to vary an equivalent reactance in parallel with the output terminal. A controller generates the control signal and a commanded phase. The commanded phase controls the RF drive signal. The reactance is at least one of a capacitance or an inductance, and the capacitance or the inductance varies in accordance with the control signal.

30 Claims, 24 Drawing Sheets

(51) Int. Cl.
*H03F 1/56* (2006.01)
*H03F 3/00* (2006.01)
*H03F 3/195* (2006.01)
*H03F 3/24* (2006.01)

(52) U.S. Cl.
CPC ....... *H03F 3/195* (2013.01); *H03F 2200/318* (2013.01); *H03F 2200/421* (2013.01); *H03F 2200/451* (2013.01)

(58) Field of Classification Search
USPC .................................................. 330/296, 297
See application file for complete search history.

(56) References Cited

U.S. PATENT DOCUMENTS

| | | | |
|---|---|---|---|
| 8,110,991 | B2 | 2/2012 | Coumou |
| 8,395,322 | B2 | 3/2013 | Coumou |
| 9,748,864 | B2 | 8/2017 | Luu |
| 9,991,742 | B2 * | 6/2018 | Mao ........................ H02J 50/12 |
| 10,049,857 | B2 | 8/2018 | Fisk, II et al. |
| 10,546,724 | B2 | 1/2020 | Radomski et al. |
| 10,821,542 | B2 | 11/2020 | Nelson et al. |
| 11,545,943 | B2 * | 1/2023 | Nguyen ............... H02M 1/0058 |
| 2007/0035971 | A1 | 2/2007 | Yasumura |
| 2015/0311724 | A1 | 10/2015 | Callanan |
| 2018/0212523 | A1 | 7/2018 | Leabman |
| 2020/0176221 | A1 | 6/2020 | Prager et al. |

FOREIGN PATENT DOCUMENTS

| | | |
|---|---|---|
| CN | 108696119 A | 10/2018 |
| CN | 110112937 A | 8/2019 |
| JP | 6157716 B2 | 7/2017 |
| TW | 201931754 A | 8/2019 |
| WO | WO-2018125041 A1 | 7/2018 |
| WO | WO-2020094723 A1 | 5/2020 |

OTHER PUBLICATIONS

International Search Report and Written Opinion regarding International Application No. PCT/US2021/053148, dated Jan. 21, 2022.
Taiwanese Office Action regarding Application No. 110138241, mailed Oct. 7, 2022.

* cited by examiner

SWITCHED CAPACITOR MODULATOR

CROSS-REFERENCE TO RELATED APPLICATIONS

This application is a continuation of U.S. patent application Ser. No. 17/111,700 filed on Dec. 4, 2020. The entire disclosure of the above application is incorporated herein by reference.

FIELD

The present disclosure relates to RF generator systems and to DC power supplies for RF generators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A RF generator includes a rectifier configured to receive an AC signal from a facility power source and generating a rectified voltage. The RF generator also includes a RF power amplifier configured to receive the rectified voltage and a RF drive signal and to modulate an input signal in accordance with the rectified voltage to generate a RF output signal to an output terminal. The RF generator also includes a capacitance in parallel with the output terminal, the capacitance configured to vary in accordance with a capacitor control signal to vary an equivalent capacitance at the output terminal.

Implementations may include one or more of the following features. The RF generator where the RF drive signal determines a frequency and power of the RF output signal. The RF power source includes a plurality of RF power amplifiers and the RF drive signal includes a plurality of RF drive signals. The plurality of RF power amplifiers are configured to operate at a phase in order to vary a magnitude of the RF output signal. The RF output signal has a power that varies in accordance with the phase and the equivalent capacitance. The RF generator further including a controller configured to generate a commanded duty cycle and a commanded phase in accordance with a setpoint of a selected parameter and a measurement of the selected parameter. The controller further includes a SVC controller configured to generate the commanded duty cycle in accordance with a difference between a power setpoint and a measured power. The capacitance is configured to receive voltages from a pair of switches including a first switch connected to a first terminal of the capacitance to apply a first voltage thereto and a second switch connected to a second terminal of the capacitance to apply a second voltage thereto, the first voltage and the second voltage varying to control the equivalent capacitance. The RF generator further including a SVC driver configured to generate control signals to actuate the pair of switches in accordance with the commanded duty cycle. The RF generator further including a drive PID configured to generate the commanded phase in accordance with a difference between a power setpoint and a measured power. The RF generator further including a direct digital synthesizer (DDS) configured to generate the plurality of RF drive signals in accordance with the commanded phase. The RF generator further including a drive PID configured to generate the commanded phase in accordance with a difference between a power setpoint and a measured power. The RF generator further including a direct digital synthesizer (DDS) configured to generate the plurality of RF drive signals in accordance with the commanded phase. The RF generator further including a SVC driver configured to generate control signals to actuate the pair of switches in accordance with the commanded duty cycle. The plurality of RF drive signals are selected so that the plurality of RF power amplifiers operate at a selected phase. The capacitance is configured to receive voltages from a pair of switches including a first switch connected to a first terminal of the capacitance to apply a first voltage thereto and a second switch connected to a second terminal of the capacitance to apply a second voltage thereto, the first voltage and the second voltage varying to control the equivalent capacitance. The first voltage applied to the first terminal and the second voltage applied to the second terminal vary the equivalent capacitance. The pair of switches are operated a selected duty cycle, and the selected duty cycle determines the equivalent capacitance. The selected duty cycle is less than or equal to 0.4. The pair of switches is operated in accordance with the first zero cross. One of the pair of switches is operated in accordance with the first zero crossing and the other of the pair of switches is operated in accordance the second zero crossing. At least one of the pair of switches is activated relative to the first zero crossing to effect a zero voltage switching of the at least one of the pair of switches. An other of the at least one of the pair of switches is activated relative to the first zero crossing to effect a zero voltage switching of the other of the at least one of the pair of switches. An other of the at least one of the pair of switches is activated relative to a second zero voltage crossing to effect a zero voltage switching of the other of the at least one of the pair of switches. The rectifier includes one of a boost converter or a buck converter to respectively increase or decrease the rectified voltage prior to output to the RF power amplifier. Implementations of the described techniques may include hardware, a method or process, or computer software on a computer-accessible medium.

One general aspect includes a switched capacitor modulator (SCM). The switched capacitor modulator also includes a RF power amplifier configured to receive a rectified voltage and a RF drive signal and to modulate an input signal in accordance with the rectified voltage to generate a RF output signal to an output terminal. The switched capacitor modulator also includes a reactance in parallel with the output terminal, the reactance configured to vary in response to a control signal to vary an equivalent reactance in parallel with the output terminal. The switched capacitor modulator also includes a controller configured to generate the control signal and a commanded phase, where the commanded phase controls the RF drive signal.

Implementations may include one or more of the following features. The SCM where the reactance is at least one of a capacitance or an inductance, and where the at least one of the capacitance or the inductance varies in accordance with the control signal. The reactance includes a capacitance in parallel with the output terminal, the capacitance is configured to receive voltages from a pair of switches including a first switch connected to a first terminal of the capacitance to apply a first voltage thereto and a second switch connected to a second terminal of the capacitance to apply a second voltage thereto, the control signal including the first voltage and the second voltage to control the equivalent reactance. The control signal includes a commanded duty cycle, where the commanded duty cycle controls the first voltage and the second voltage. The RF power source includes a plurality of RF power amplifiers and the RF drive signal includes a plurality of RF drive signals, and where the commanded phase controls the RF drive signal applied to each of the plurality of RF power amplifiers and varies a magnitude of the RF output signal. The controller further includes a SVC controller configured to generate the commanded duty cycle in accordance with a difference between a power setpoint and a measured power. The SCM further including a SVC driver configured to generate control signals to actuate the pair of switches in accordance with the commanded duty cycle. The SCM further including a direct digital synthesizer (DDS) configured to generate the plurality of RF drive signals in accordance with the commanded phase. The plurality of RF drive signals are selected so that the plurality of RF power amplifiers operate at a selected phase. The first voltage applied to the first terminal and the second voltage applied to the second terminal vary the equivalent reactance and where the pair of switches are operated a selected duty cycle, and the selected duty cycle determines the equivalent reactance. The pair of switches is operated in accordance with the first zero cross. At least one of the pair of switches is activated relative to the first zero crossing to effect a zero voltage switching of the at least one of the pair of switches. An other of the at least one of the pair of switches is activated relative to the first zero crossing to effect a zero voltage switching of the other of the at least one of the pair of switches. Implementations of the described techniques may include hardware, a method or process, or computer software on a computer-accessible medium.

One general aspect includes a non-transitory computer-readable medium storing instructions. The non-transitory computer-readable medium storing instructions also includes rectifying AC power from a facility power source to generate a rectified voltage. The non-transitory computer-readable medium storing instructions also includes generating a RF output signal to an output terminal in accordance with the rectified voltage and a RF drive signal. The non-transitory computer-readable medium storing instructions also includes applying voltage to control a reactance electrically communicating with the output terminal in accordance with an output from a switch to varying an equivalent reactance in parallel with the output terminal. The non-transitory computer-readable medium storing instructions also includes generating a commanded reactance control signal and a commanded phase, where the commanded reactance control signal controls the equivalent reactance. Other embodiments of this aspect include corresponding computer systems, apparatus, and computer programs recorded on one or more computer storage devices, each configured to perform the actions of the methods.

Implementations may include one or more of the following features. The non-transitory computer-readable medium further including generating the RF output from a plurality of RF power amplifiers, where the RF drive signal includes a plurality of RF drive signals, and where the commanded phase controls the RF drive signal applied to each of the plurality of RF power amplifiers, where varying the commanded phase varies a magnitude of the RF output signal and the RF output signal has a power that varies in accordance with the commanded phase and the equivalent reactance. The non-transitory computer-readable medium further including controlling signals to the switch to in accordance with a commanded duty cycle, and generating the plurality of RF drive signals in accordance with the commanded phase. The non-transitory computer-readable medium further including controlling the switch to a selected duty cycle to determine the equivalent reactance. The switch is operated in accordance with the first zero cross. Implementations of the described techniques may include hardware, a method or process, or computer software on a computer-accessible medium.

One general aspect includes a method for generating a radio frequency (RF) signal. The method also includes rectifying AC power from a facility power source to generate a rectified voltage. The method also includes generating a RF output signal to an output terminal in accordance with the rectified voltage and a RF drive signal. The method also includes applying voltages to respective terminals of a capacitor in parallel with the output terminal from a pair of switches including a first switch connected to a first terminal of the capacitor to apply a first voltage thereto and a second switch connected to a second terminal of the capacitor to apply a second voltage thereto, the first voltage and the second voltage varying an equivalent capacitance in parallel with the output terminal. The method also includes generating a commanded duty cycle and a commanded phase, where the commanded duty cycle controls the first voltage and the second voltage, and the commanded phase controls the RF drive signal. Other embodiments of this aspect include corresponding computer systems, apparatus, and computer programs recorded on one or more computer storage devices, each configured to perform the actions of the methods.

Implementations may include one or more of the following features. The method further including generating the RF output from a plurality of RF power amplifiers, where the RF drive signal includes a plurality of RF drive signals, and where the commanded phase controls the RF drive signal applied to each of the plurality of RF power amplifiers, where varying the commanded phase varies a magnitude of the RF output signal and the RF output signal has a power that varies in accordance with the commanded phase and the equivalent capacitance. The method further including controlling signals to actuate the pair of switches in accordance with the commanded duty cycle, and generating the plurality of RF drive signals in accordance with the commanded phase. The method further including controlling the pair of switches to a selected duty cycle to determine the equivalent capacitance. The pair of switches is operated in accordance with the first zero cross. One the pair of switches is operated in accordance with the first zero crossing and the other of the pair of switches is operated in accordance the second zero crossing. Rectifying further includes one of increases or decreases the rectified voltage via a respective boost converter or buck converter prior to generating the RF output signal. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
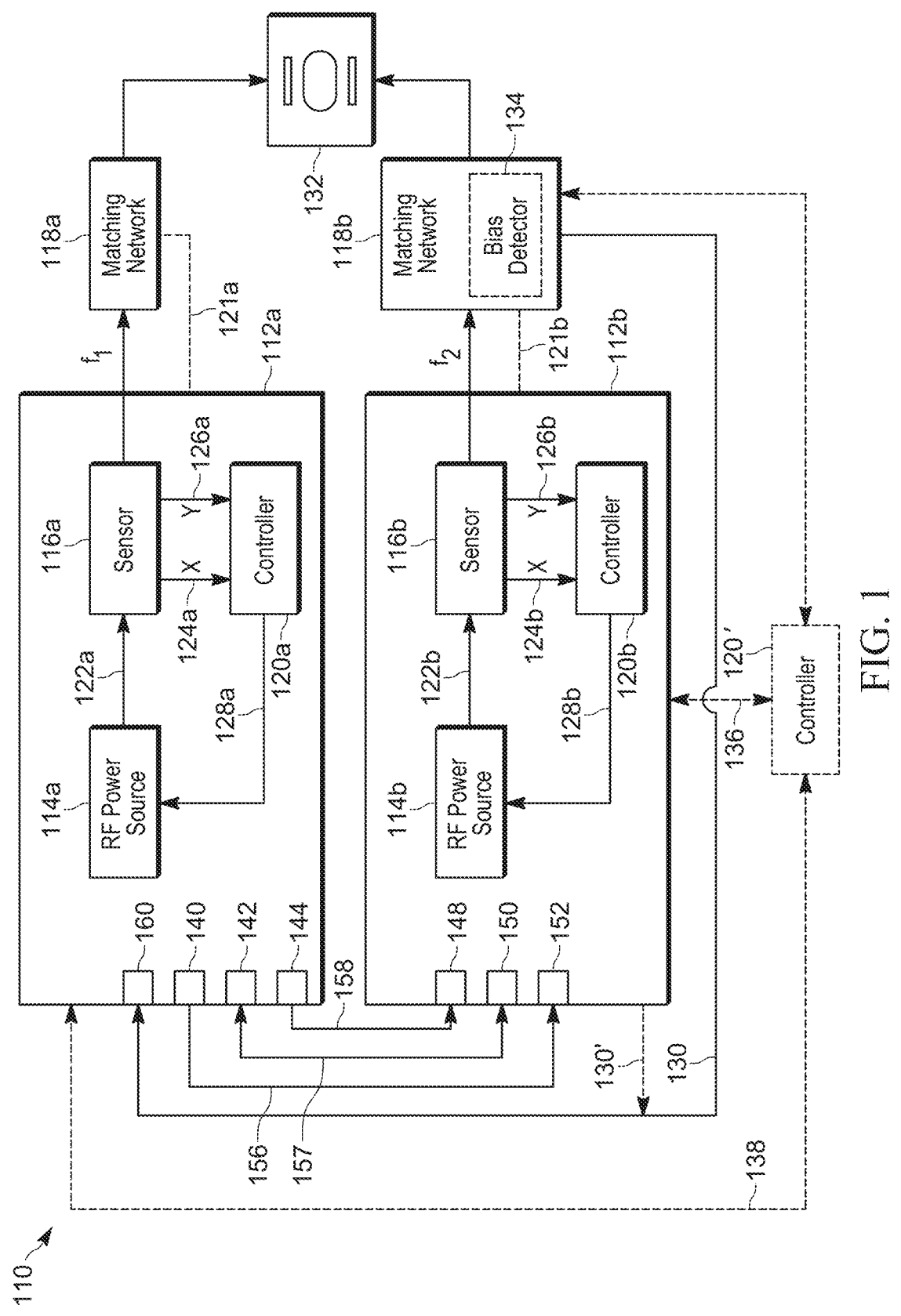
FIG. 1 is a schematic diagram of a power delivery system having multiple power supplies arranged according to various embodiments of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent, the pulsing of a second RF generator is controlled in accordance with detecting at the second RF generator the pulsing of a first RF generator, thereby synchronizing pulsing between the two RF generators.

FIG. 1 shows a RF generator or power supply system 110. Power supply system 110 includes a pair of radio frequency (RF) generators or power supplies 112*a*, 112*b*, matching networks 118*a*, 118*b*, and load 132, such as a non-linear load, which may be a plasma chamber, process chamber, and the like. In various embodiments, RF generator 112*a* is referred to as a source RF generator or power supply, and matching network 118*a* is referred to as a source matching network. Also in various embodiments, RF generator 112*b* is referred to as a bias RF generator or power supply, and matching network 118*b* is referred to as a bias matching network. It will be understood that the components can be referenced individually or collectively using the reference number without a letter subscript or a prime symbol.

In various embodiments, source RF generator 112*a* receives a control signal 130 from matching network 118*b*, or a control signal 130' from bias RF generator 112*b*. As will be explained in greater detail, control signal 130 or 130' represents an input signal to source RF generator 112a that indicates one or more operating characteristics or parameters of bias RF generator 112b. In various embodiments, a synchronization bias detector 134 senses the RF signal output from matching network 118b to load 132 and outputs a synchronization or trigger signal 130 to source RF generator 112a. In various embodiments, synchronization or trigger signal 130' may be output from bias RF generator 112b to source RF generator 112a, rather than trigger signal 130. A difference between trigger or synchronization signals 130, 130' may result from the effect of matching network 118b, which can adjust the phase between the input signal to and output signal from matching network. Signals 130, 130' include information about the operation of bias RF generator 112b that in various embodiments enables predictive responsiveness to address periodic fluctuations in the impedance of plasma chamber 132 caused by the bias RF generator 112b. When control signals 130 or 130' are absent, RF generators 112a, 112b operate autonomously.

RF generators 112a, 112b include respective RF power sources or amplifiers 114a, 114b, RF sensors 116a, 116b, and processors, controllers, or control modules 120a, 120b. RF power sources 114a, 114b generate respective RF power signals 122a, 122b output to respective sensors 116a, 116b. Sensors 116a, 116b receive the output of RF power sources 114a, 114b and generate respective RF power signals f1 and f2. Sensors 116a, 116b also output signals that vary in accordance with various parameters sensed from load 132. While sensors 116a, 116b, are shown within respective RF generators 112a, 112b, RF sensors 116a, 116b can be located externally to the RF power generators 112a, 112b. Such external sensing can occur at the output of the RF generator, at the input of an impedance matching device located between the RF generator and the load, or between the output of the impedance matching device (including within the impedance matching device) and the load.

Sensors 116a, 116b detect various operating parameters and output signals X and Y. Sensors 116a, 116b may include voltage, current, and/or directional coupler sensors. Sensors 116a, 116b may detect (i) voltage V and current I and/or (ii) forward power $P_{FWD}$ output from respective power amplifiers 114a, 114b and/or RF generators 112a, 112b and reverse or reflected power $P_{REV}$ received from respective matching network 118a, 118b or load 132 connected to respective sensors 116a, 116b. The voltage V, current I, forward power $P_{FWD}$, and reverse power $P_{REV}$ may be scaled and/or filtered versions of the actual voltage, current, forward power, and reverse power associated with the respective power sources 114a, 114b. Sensors 116a, 116b may be analog and/or digital sensors. In a digital implementation, the sensors 116a, 116b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 116a, 116b generate sensor signals X, Y, which are received by respective controllers or power control modules 120a, 120b. Power control modules 120a, 120b process the respective X, Y signals 124a, 126a and 124b, 126b and generate one or a plurality of feedforward and/or feedback control signals 128a, 128b to respective power sources 114a, 114b. Power sources 114a, 114b adjust the RF power signals 122a, 122b based on received feedback and/or feedforward control signal. In various embodiments, power control modules 120a, 120b may control matching networks 118a, 118b, respectively, via respective control signals 121a, 121b. Power control modules 120a, 120b may include, at least, proportional integral derivative (PID) controllers or subsets thereof and/or direct digital synthesis (DDS) component(s) and/or any of the various components described below in connection with the modules.

In various embodiments, power control modules 120a, 120b are PID controllers or subsets thereof and may include functions, processes, processors, or submodules. Control signals 128a, 128b may be command drive signals and may include DC offset or rail voltage, voltage or current magnitude, frequency, and phase components. In various embodiments, feedback control signals 128a, 128b can be used as inputs to one or multiple control loops. In various embodiments, the multiple control loops can include a proportional-integral-derivative (PID) control loop for RF drive, and for rail voltage. In various embodiments, feedback control signals 128a, 128b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 128a, 128b can provide feedforward control as described in U.S. Pat. No. 10,049,857, assigned to the assignee of the present application and incorporated by reference herein.

In various embodiments, power supply system 110 can include controller 120'. Controller 120' may be disposed externally to either or both of RF generators 112a, 112b and may be referred to as external or common controller 120'. In various embodiments, controller 120' may implement one or a plurality of functions, processes, or algorithms described herein with respect to one or both of controllers 120a, 120b. Accordingly, controller 120' communicates with respective RF generators 112a, 112b via a pair of respective links 136, 138 which enable exchange of data and control signals, as appropriate, between controller 120' and RF generators 112a, 112b. For the various embodiments, controllers 120a, 120b, 120' can distributively and cooperatively provide analysis and control along with RF generators 112a, 112b. In various other embodiments, controller 120' can provide control of RF generators 112a, 112b, eliminating the need for the respective local controllers 120a, 120b.

In various embodiments, RF power source 114a, sensor 116a, controller 120a, and matching network 118a can be referred to as source RF power source 114a, source sensor 116a, source controller 120a, and source matching network 118a. Similarly in various embodiments, RF power source 114b, sensor 116b, controller 120b, and matching network 118b can be referred to as bias RF power source 114b, bias sensor 116b, bias controller 120b, and bias matching network 118b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 112a and bias RF generator 112b include multiple ports to communicate externally. Source RF generator 112a includes a pulse synchronization output port 140, a digital communication port 142, and an RF output port 144. Bias RF generator 112b includes an RF input port 148, a digital communication port 150, and a pulse synchronization input port 152. Pulse synchronization output port 140 outputs a pulse synchronization signal 156 to pulse synchronization input port 152 of bias RF generator 112b. Digital communication port 142 of source RF generator 112a and digital communication port 150 of bias RF generator 112b communicate via a digital communication link 157. RF output port 144 generates a RF control signal 158 input to RF input port 148. In various embodiments, RF control signal 158 is substantially the same as the RF control signal controlling source RF generator 112a. In various other embodiments, RF control signal 158 is the same as the RF control signal controlling source RF generator 112a, but is phase shifted within source RF generator 112a in accordance with a requested phase shift generated by bias RF generator 112b. Thus, in various embodiments, source RF generator 112a and bias RF generator 112b are driven by substantially identical RF control signals or by substantially identical RF control signal phase shifted by a predetermined amount.

Figure 2:
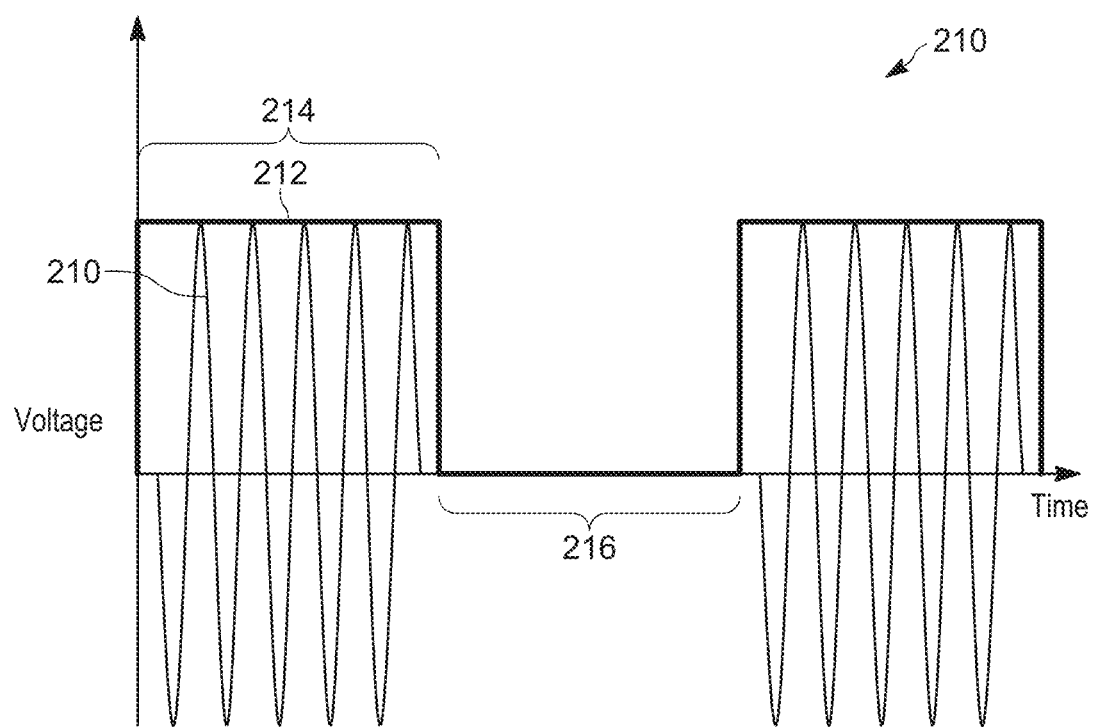
FIG. 2 shows waveforms of a RF signal and a pulse modulating the RF signal.

FIG. 2 shows a plot of voltage versus time to describe a pulse mode of operation for delivering power to a load, such as load 132 of FIG. 1. In FIG. 2, RF signal 210 is modulated by pulse 212. As shown at period or region 214 of pulse 212, when pulse 212 is ON, RF generator 112 outputs RF signal 210. During period or region 216 of pulse 212, pulse 212 is OFF, and RF generator 112 does not output RF signal 210. Pulse signal 212 can repeat at a constant duty cycle or a variable duty cycle. Further, pulse signal 212 need not be embodied as a square wave as shown in FIG. 2. Further yet, pulse 212 can have multiple ON and OFF regions of varying amplitude and duration. The multiple regions may repeat within a fixed or variable period.

RF power sources 114a, 114b of FIG. 1 include RF power amplifiers. Typical RF power amplifiers are powered off of standard electrical power delivered by the facility power, such as two or three phase alternating current (AC) power. Multiphase AC power, however, is not suitable for providing RF power at a reliable power or frequency. Consequently, facility power from the facility power source is typically converted to direct current (DC) power, which is then used as a rail voltage to drive power amplifiers which in turn generate a reliable RF signal having a reliable power and frequency.

Figure 3:
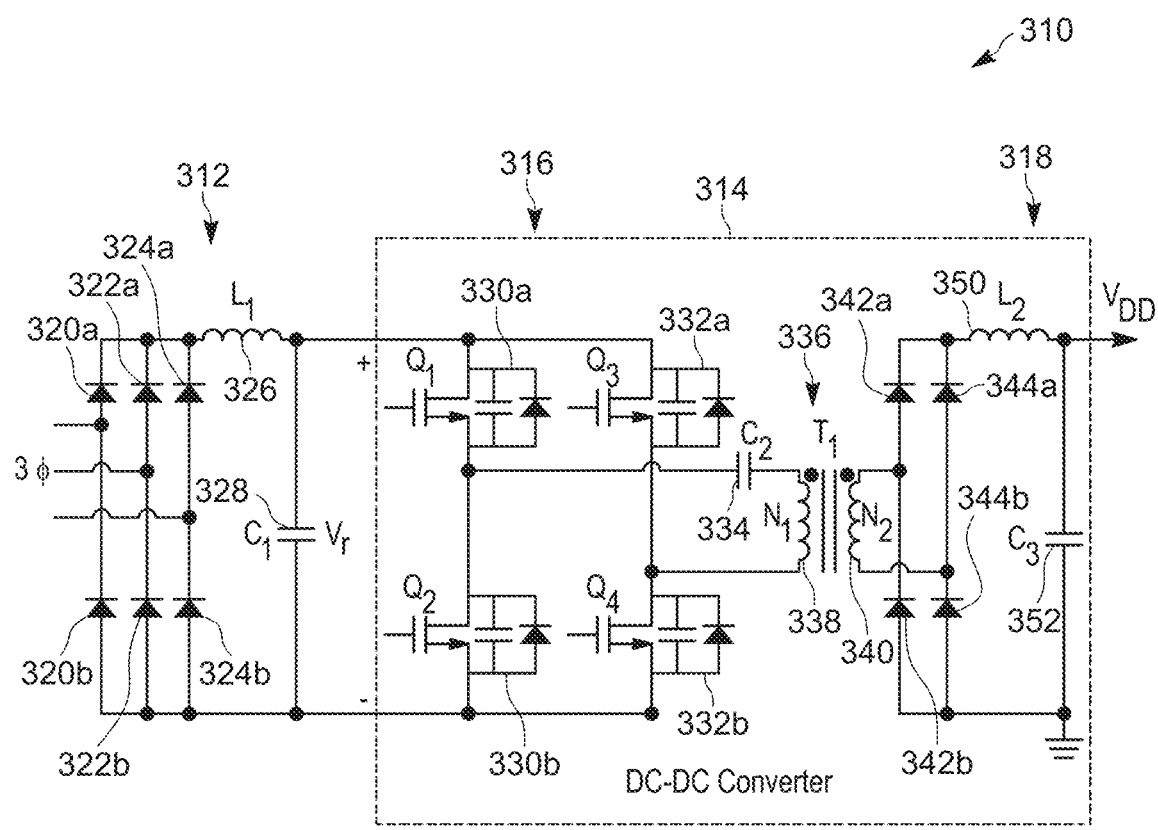
FIG. 3 shows an AC to DC converter including a DC to DC converter arranged in a conventional manner.

FIG. 3 shows an AC-DC converter 310 including an inverter 312 that converts AC power to DC power and a DC-DC converter 314 that receives DC input from inverter 312 and generates a conditioned DC signal ($V_{DD}$) at its output. As shown in FIG. 3, inverter 312 receives three AC inputs representing a three phase AC input to generate a rectified voltage $V_r$. Each leg of the rectifier 312 includes diodes or silicon controlled rectifiers (SCR) arranged in pairs, such as 320a, 320b; 322a, 322b; and 324a, 324b. Output from rectifier 312 is applied to a filter including inductor $L_1$ 326 and capacitor $C_1$ 328. Rectified voltage $V_r$ is thus generated across capacitor 328. Rectified voltage $V_r$ is a DC voltage that is typically not suitable for generating an acceptable RF output signal in a RF generator. The rectified DC output $V_r$ requires conditioning and is applied to DC-DC converter 314. DC-DC converter 314 includes a full bridge inverter 316 which includes switch pairs 330a, 330b in a first leg and 332a, 332b in a second leg. The individual switches 330a, 330b, 332a, 332b can be represented using respective symbols $Q_1$, $Q_2$, $Q_3$, $Q_4$. The output from inverter 316 is input to primary winding $N_1$ 338 of transformer $T_1$ 336 through a DC blocking capacitor $C_2$. Transformer 336 isolates inverter 316 from rectifier 318. Transformer 336 also optionally provides step up or step down capability, as is well known in the art. Transformer 336 also includes secondary winding 340. The terminals of secondary winding 340 connect to each of a pair of legs of rectifier 318. Similarly to rectifier 312, rectifier 318 includes switch pairs in each leg, such as switch pairs 342a, 342b in a first leg and 344a, 344b in a second leg. A filter at the output of rectifier 318 includes inductor $L_2$ 350 capacitor $C_3$ 352. The output from AC-DC converter 310 generates an output voltage $V_{DD}$.

In various power amplifiers, output voltage $V_{DD}$ provides a rail voltage to drive a high power amplifier. As will be described herein, the power amplifier can include one or multiple power amplifiers arranged in series or in parallel. Various power amplifiers include a single power amplifier whose output is typically controlled by varying the duty cycle of switches that receive $V_{DD}$ to generate RF output power. In various other configurations, a power amplifier may include multiple power amplifiers which, in addition to controlling the switches of a single power amplifier, are operated at relative phases (outphasing) to generate two RF signals which are combined, typically through multiple primary winding of a transformer to generate a RF output controlled to a varying magnitude.

Figure 4:
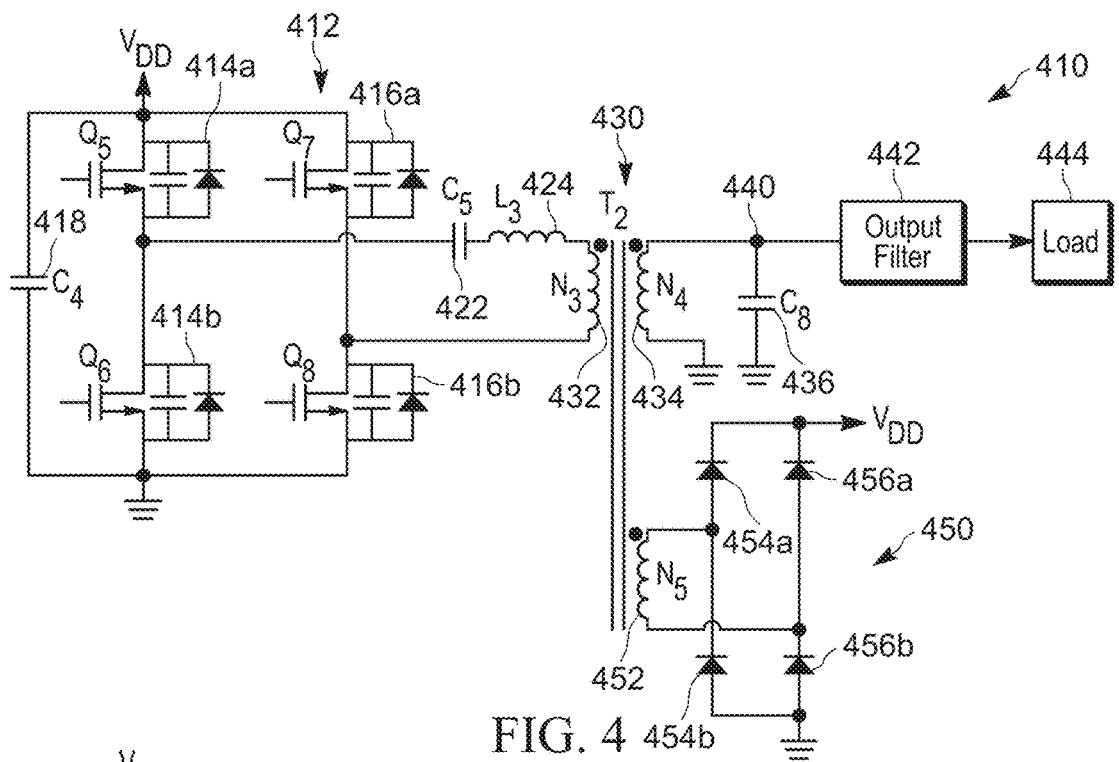
FIG. 4 shows a power amplifier having a single power amplifier and a load voltage clamping circuit arranged in a conventional manner.

FIG. 4 shows a power amplifier 410 including a single power amplifier 412, transformer 430, and clamping circuit 450 which cooperate to generate a RF output signal at output terminal 440. Power amplifier 412 is implemented as a full bridge inverter having a pair of legs including switch pairs $Q_5$, $Q_6$ (414a, 414b) and $Q_7$, $Q_8$ (416a, 416b). As is well known in the art, the switch pairs $Q_5$, $Q_8$ and $Q_6$, $Q_7$ are controlled using RF drive signals so that each pair, when connected to primary winding 432 of transformer 430, operate in a push pull configuration to convert the DC input voltage to an AC output voltage. Power amplifier 412 also includes a capacitor $C_4$ 418 to improve operation of power amplifier 412. The output of power amplifier 412 is applied to primary winding 432 of transformer 430 via an output filter including capacitor $C_5$ 422 and inductor $L_3$ 424. The RF signal is coupled across the core of transformer 430 to secondary winding 434 to generate a RF signal at output terminal 440. A capacitor $C_5$ 436 is connected between output terminal 440 and ground to provide a load line adjustment. Output terminal 440 is connected to an output filter 442 which filters the RF signal prior to output to load 444.

FIG. 4 also includes a circuit implementing a voltage clamp 450 connected to transformer $T_2$ via a tertiary winding $N_5$ 452. Voltage clamp 450 rectifies the AC input voltage at tertiary winding 452 to a DC signal. Voltage clamp 450 includes a pair of legs each connected to a terminal of tertiary winding 452. Each leg includes a rectifier pair, such as silicon control rectifiers (SCR) 454a, 454b and 456a, 456b. The rectified voltage is clamped to a diode voltage area above and below respective positive and negative rails of $V_{DD}$. Operation of voltage clamp 450 is explained in detail in U.S. Pat. No. 9,748,864, which is assigned to the assignee of the present application and incorporated by reference in this application.

In a typical configuration, switch pairs $Q_5$, $Q_8$ are operated in tandem and switch pairs $Q_6$, $Q_7$ are operated in tandem at a specified duty cycle. Typically, switch pairs $Q_5$, $Q_8$ are operated at preconfigured degrees out of phase from switch pairs $Q_6$, $Q_7$ in order to provide a desired RF output. In various configurations, turn on and turn off of switch pairs $Q_5$, $Q_8$ and $Q_6$, $Q_7$ can be varied in order to provide soft switching and protection of switches $Q_5$, $Q_6$, $Q_7$, and $Q_8$. In various configurations, the switch pairs are operated at a 50% duty cycle including dead time when all the switches are off to operate the power amplifier at zero voltage switching.

Figure 5:
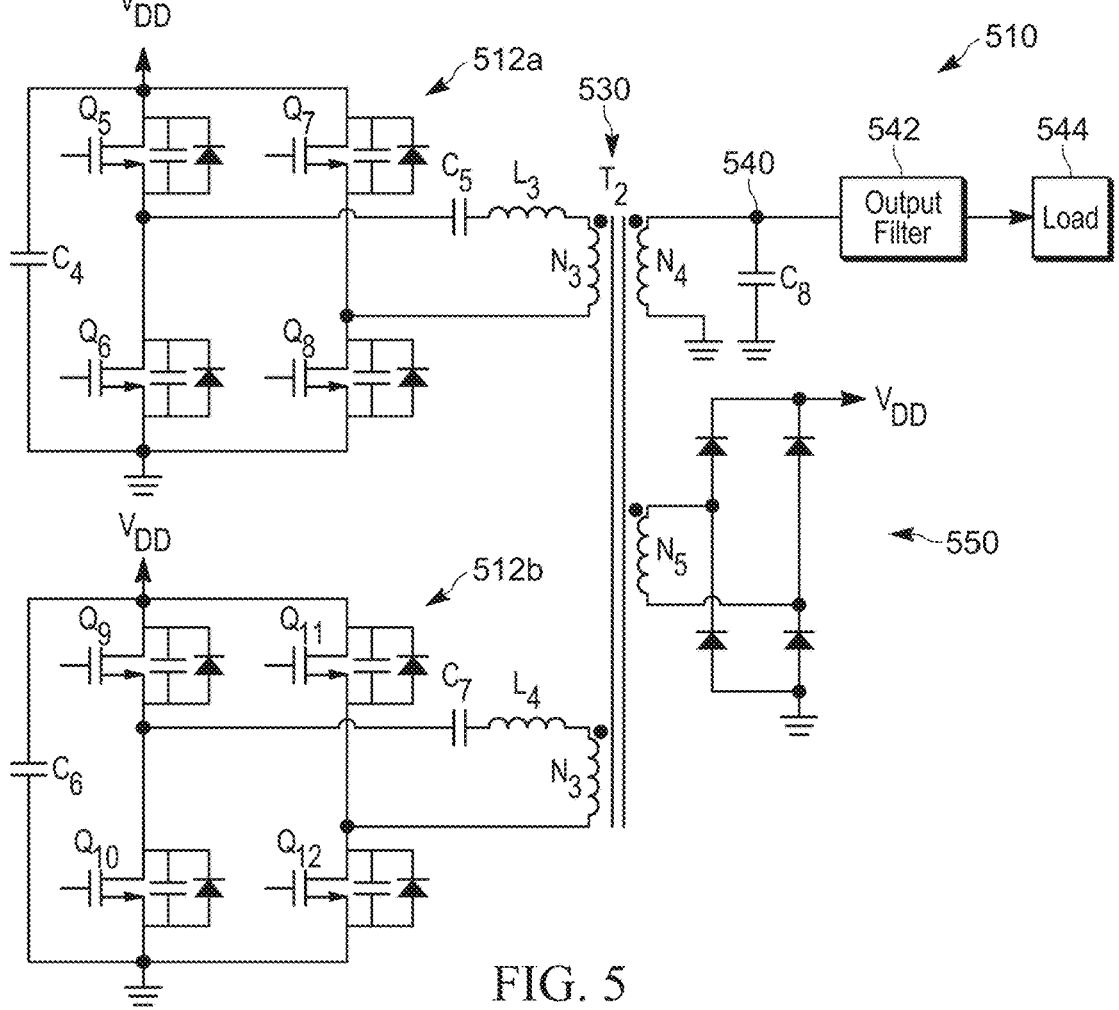
FIG. 5 shows a power amplifier including a pair of power amplifiers and a load voltage clamping circuit arranged in a conventional manner.

FIG. 5 shows power amplifier 510 including a pair of power amplifiers 512a, 512b. The power amplifiers 512a, 512b operate as described above with respect to power amplifier 412 of FIG. 4. Similar components of FIG. 4 will not be described in detail of FIG. 5 where such components operate similarly. Power amplifiers 512a, 512b are operated using an outphasing mode of operation. That is, the switch pairs $Q_5$, $Q_8$ and $Q_6$, $Q_7$ are controlled using RF drive signals and the switch pairs $Q_9$, $Q_{12}$ and $Q_{10}$, $Q_{11}$ are controlled using a different set of RF drive signals so that amplifiers 512a, 512b operates a relative phase to control the magnitude of the RF output signal at output terminal 540. With proper phase selection between power amplifiers 512a, 512b, the RF signal at output terminal signal 516 can range from zero to approximately the maximum output of power amplifier 512a combined with the maximum output of power amplifier 512b.

Figure 6:
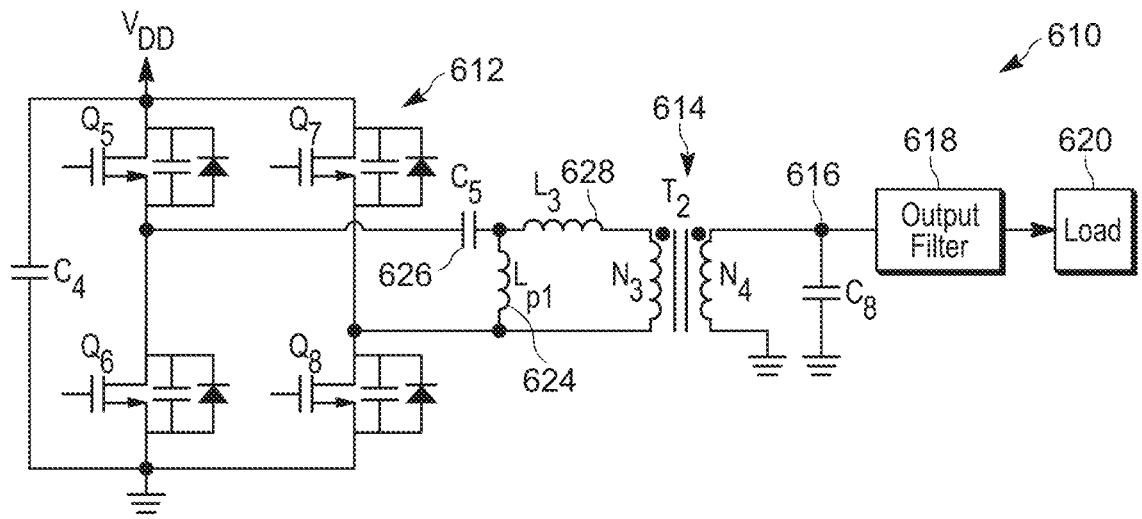
FIG. 6 shows a power amplifier system having a single power amplifier and a parallel inductor for soft-switching.

FIG. 6 shows a power amplifier 610 arranged similarly to FIG. 4. A difference in FIG. 6 from FIG. 4 is the omission of voltage clamp 450. FIG. 6 includes power amplifier 612, transformer 614, output terminal 616, output filter 618, and load 620, all of which operate similarly as described above. FIG. 6 also includes a parallel input inductor $L_{p1}$ 624 having a first terminal connected between a terminal of capacitor $C_5$ 626 and of inductor $L_3$ 628 and a second terminal connected to transformer primary winding 614. $L_{p1}$ provides a clamping function by compensating for reactive loads, such as capacitive and inductive loads. By compensating for an inductive load, inductor $L_{p1}$ 624 provides a clamping function that increases soft switching conditions under a wide range of loads.

Figure 7:
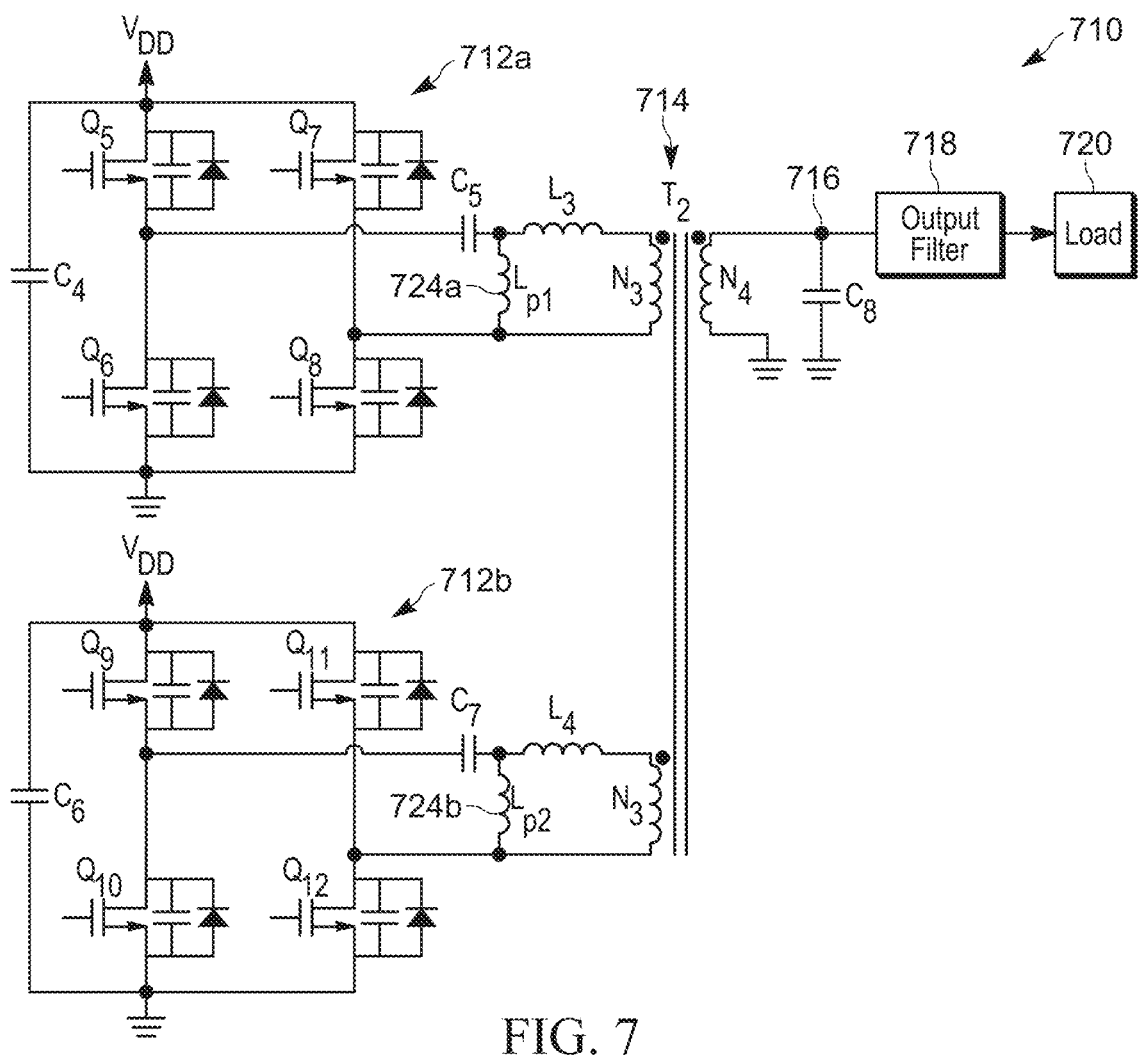
FIG. 7 shows a power amplifier system having a pair of power amplifiers, each including a parallel input inductor for soft-switching.

FIG. 7 shows a power amplifier 710 including a pair of power amplifiers 712a, 712b that receive an input signal $V_{DD}$ and output a RF signal to the primary winding $N_3$ of transformer 714. FIG. 7 is arranged similarly to FIG. 6 and further includes a pair of power amplifiers 712a, 712b. FIG. 7 also includes a pair of parallel inductors $L_{p1}$ 724a and $L_{p2}$ 724b. FIG. 7 operates similarly as described with respect to FIG. 5, where power amplifiers 712a and 712b are outphased in order to control the magnitude of the RF signal.

Figure 8:
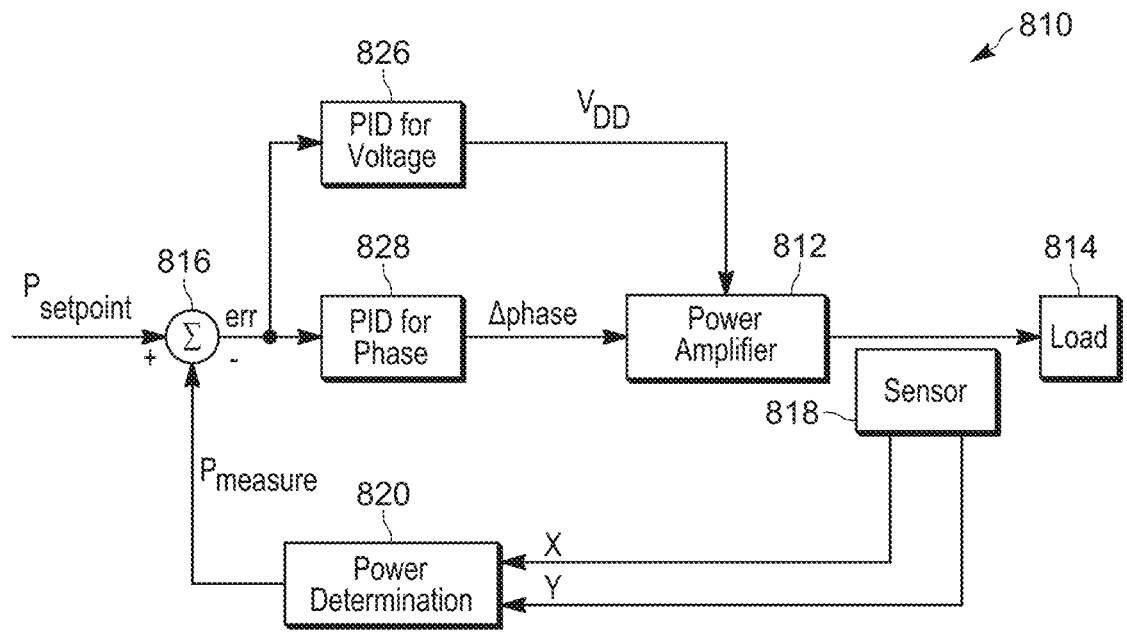
FIG. 8 shows a block diagram for phase and voltage control of a power amplifier.

FIG. 8 shows a block diagram for a conventional power amplifier control system 810. Power amplifier control system includes a power amplifier 812 that generates a RF signal to load 814. Power amplifier 812 may include one or a plurality of power amplifiers arranged in various configurations, such as those described above. The output from power amplifier 812 is measured by sensor 818 which may be any of the sensors described above. Sensor 818 outputs signals X, Y to power determination module or processor 820. Power determination module or processor 820 outputs a measured power $P_{measure}$ input to summer 816. Summer 816 also receives a power setpoint $P_{setpoint}$ and subtracts the measured power $P_{measure}$ from the power setpoint $P_{setpoint}$ in order to output an error signal err. Error signal err is input to PID controller 826 and PID controller 828. PID controller 826 is a proportional, integral, derivative controller which receives the error signal and generates a commanded $V_{DD}$ input to power amplifier 812. PID controller 828 receives the error signal and generates a phase difference for input to power amplifier 812. As will be recognized in the art, although PID controllers 826, 828 are shown as proportional, integral, derivative controllers, other controllers, as described above can be implemented. Power amplifier 812 receives the commanded rail voltage $V_{DD}$ and commanded phase signal $\Delta_{phase}$ and generates the RF output signal to load 814.

As described above, power amplifier 812 may include one or a plurality of amplifiers so that the signal output from PID controller 826 $V_{DD}$ can be applied to the one or a plurality of power amplifiers. The output from PID controller 828 to generate a $\Delta_{phase}$ may include one a plurality of $\Delta_{phase}$ signals in accordance with the number of power amplifiers that comprise power amplifier 812. In the case of power amplifier 812 being a single power amplifier, the output from PID controller 826 can be a single commanded $V_{DD}$ signal to control the one power amplifier. Also in the case of a single power amplifier, phase control refers to outphasing between two center legs, center leg 1 ($Q_5$ 414a and $Q_6$ 414b) and center leg 2 ($Q_7$ 416a and $Q_8$ 416b). In various configurations, each switch is turned on at a half cycle (50%), including deadtime, to avoid shoot-through of two switches in the same leg and to create zero voltage switching region. Such control can be viewed as outphasing two half-bridges of a full bridge amplifier. In various other configurations, half bridges of a full bridge amplifier of a plurality of power amplifiers can be outphased in addition to outphasing the plurality of power amplifiers relative to each other.

The power amplifier systems described above with respect to FIGS. 3-8 are conventionally configured. In conventionally configured power amplifiers, output power is controlled by controlling one or both of varying the DC voltage $V_{DD}$ supplied to one or a plurality of power amplifiers and, for RF power amplifiers having multiple power amplifiers, by varying the phase of the input control signals between power amplifiers. In current conventional RF generators or power amplifiers, the RF power amplifiers include single or multiple DC-DC power converters. Conventional DC-DC power converters, while providing a variable DC voltage supply to power amplifiers, can be bulky and take up significant amounts of space in a RF generator. Such DC-DC converters can cause the RF generator to be power limited based upon the size limitations.

As described above with respect to FIGS. 4 and 5, power is controlled by changing the phase difference between the legs of a single power amplifier or inverter, such as power amplifier 412 of FIG. 4 or by changing the phase difference between dual class-D power amplifiers, such as inverters 512a, 512b of FIG. 5. In such configurations, the speed at which $V_{DD}$ is controlled determines the response time of the power amplifier to vary the power of the RF signal. Thus, $V_{DD}$ response times limit achieving power control in micro second ranges. Further, power capability is limited by the number of power modules in a power amplifier, so that developing high power RF generators is limited by available space. Thus, configurations of FIGS. 4 and 5 require relatively large RF generator footprints and increase costs while structurally limiting RF output power. For similar reasons, the parallel inductors $L_{P1}$ and $L_{P2}$ of FIGS. 6 and 7 increase space and cost requirements in RF power generators.

Figure 9:
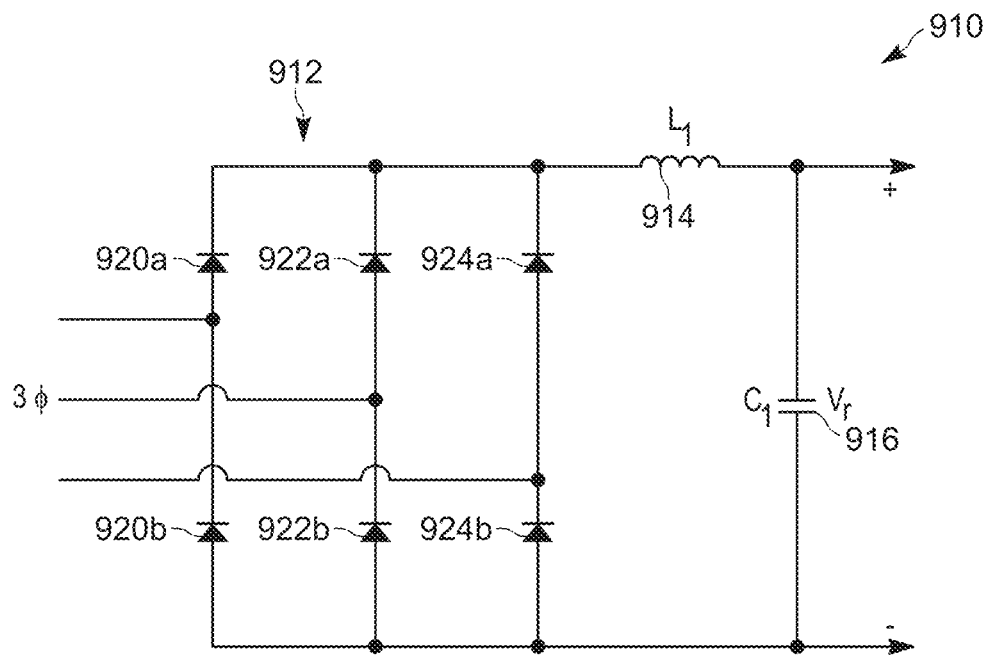
FIG. 9 shows a three phase rectifier for generating a rectified voltage.

FIG. 9 shows an AC-DC converter 910 including a diode rectifier 912 receiving a three phase power input. Each phase of the three phase power is input to a respective leg of diode rectifier 912. Each leg of diode rectifier 912 includes: diode pairs arranged in series, such as diodes 920a, 920b; 922a, 922b; and 924a, 924b. In various configurations, the diodes of rectifier 912 may be silicon controlled rectifiers (SCRs), diodes, or thyristors to rectify utility voltage. AC-DC converter 910 also includes an output filter including an inductor $L_1$ 914 and a capacitor $C_1$ 916. AC-DC converter outputs a rectified voltage $V_r$. $V_r$ can also be referred to as an uncontrolled rectified output voltage, which results from rectification of the three phase input signal via diode rectifier 912. $V_r$ is unchangeable and considered a generally constant voltage. In various configurations, $V_r$ may drop depending upon the load to which it connects since diode rectifier 912 operates in a discontinuous conduction mode. As will be described further herein, $V_r$ is input to a SCM or power amplifier having a switched variable capacitor (SVC).

Figure 10:
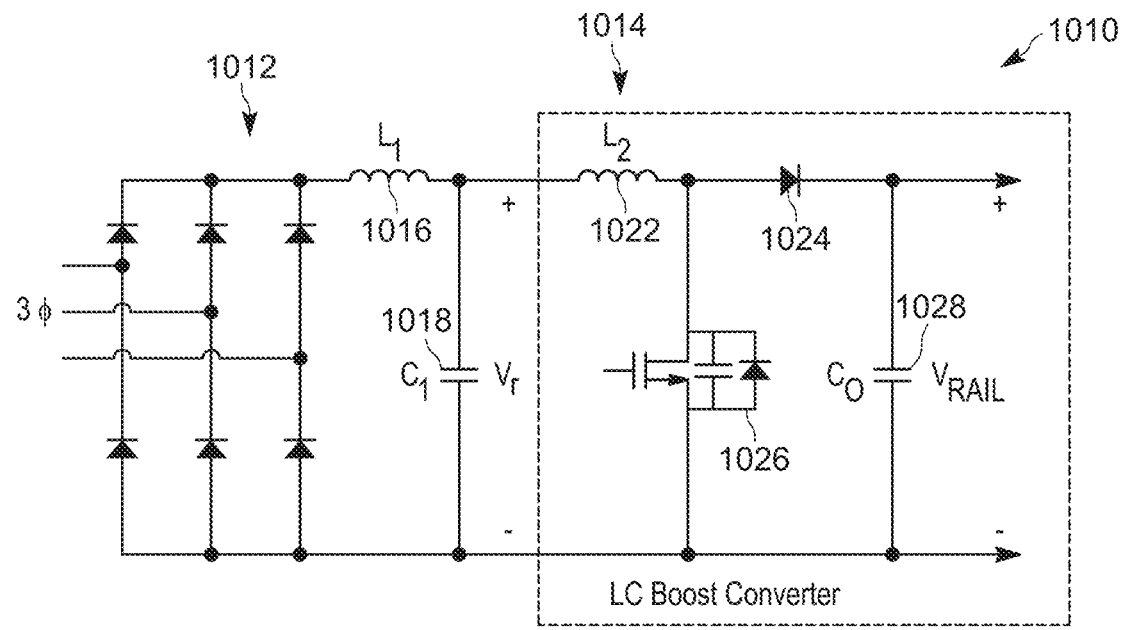
FIG. 10 shows an AC-DC converter including a boost converter.
Figure 11:
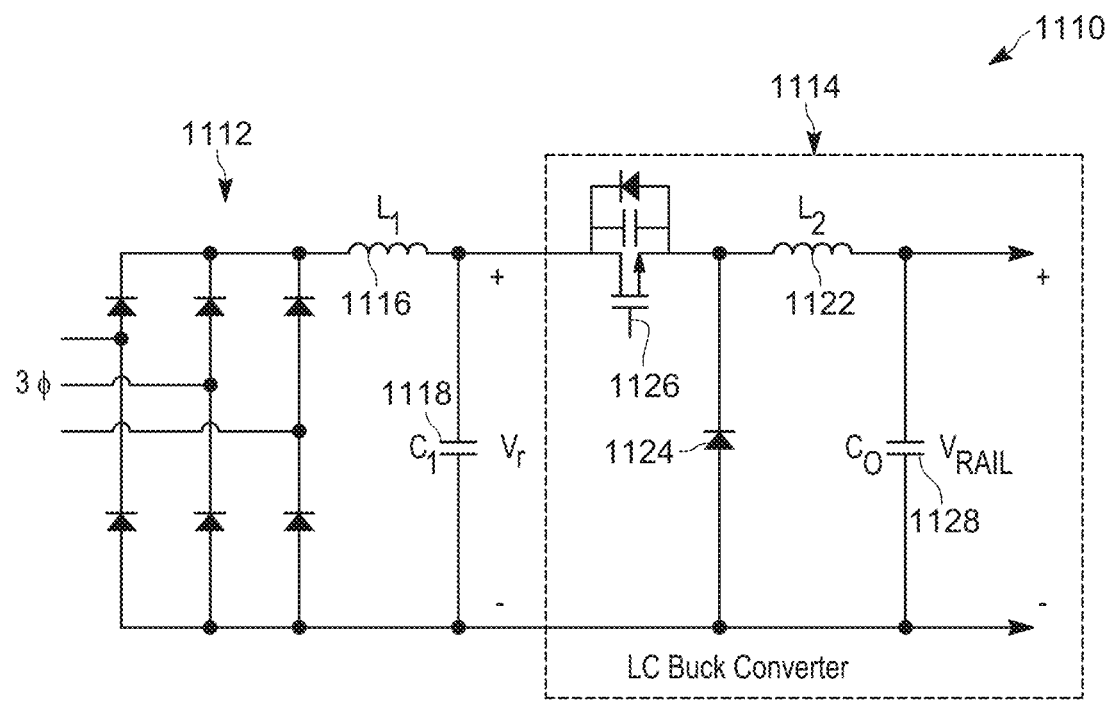
FIG. 11 shows an AC-DC converter including a buck converter.

FIGS. 10 and 11 show respective AC-DC converters 1010, 1110. AC-DC converter 1010 includes an inductor-capacitor (LC) boost converter. AC-DC converter 1110 includes an inductor-capacitor (LC) buck converter. AC-DC converter 1010 thus includes LC boost converter 1014 and includes a filter at the output of diode rectifier 1012. In various high power configurations, $L_1$ 1016 and $C_1$ 1018 increase the power factor of the system. In other configurations, $L_1$ 1016 and $C_1$ 1018 may be omitted. The filter includes an inductor $L_1$ 1016 and a capacitor $C_1$ 1018 that operates as described above to generate rectified voltage $V_r$. Rectified voltage $V_r$ is applied to a boost converter including inductor $L_2$ 1022, diode 1024, and switch 1026. Inductor 1022, diode 1024, and switch 1026 operate to provide a boost function output across additional filter capacitor $C_O$ 1028 to generate voltage $V_{RAIL}$ typically applied as an input to the power amplifier to assist in controlling power. Boost converter 1010 increases the rectified voltage $V_r$. In various configurations, boost converter 1014 maintains constant output voltage and also supports high voltage to the power amplifiers to lower effective current in power amplifier as well as boost converter 1014.

AC-DC converter 1110 includes LC buck converter 1114 having an inductor 1116 and capacitor 1118 that operates as described above to generate $V_r$. LC buck converter 1114 also includes inductor $L_2$ 1122, diode 1124, and switch 1126. Inductor 1122, diode 1124, and switch 1126 combine to provide a buck function to reduce the magnitude of $V_r$ to a lesser magnitude output across capacitor 1128 $C_O$ to generate $V_{RAIL}$. The additional boost and buck converters shown in respective FIGS. 10 and 11 regulate the rectified voltage $V_r$ to reduce voltage fluctuation at the converter outputs and provide a more stable $V_r$. Buck converter 1114 decreases the rectified voltage $V_r$. In various configurations described in the following figures and specification, $V_r$ may be converted as described in FIGS. 10 and 11 prior to application to power amplifiers. In various configurations, boost converter 1014 can also increase the power factor.

Figure 12:
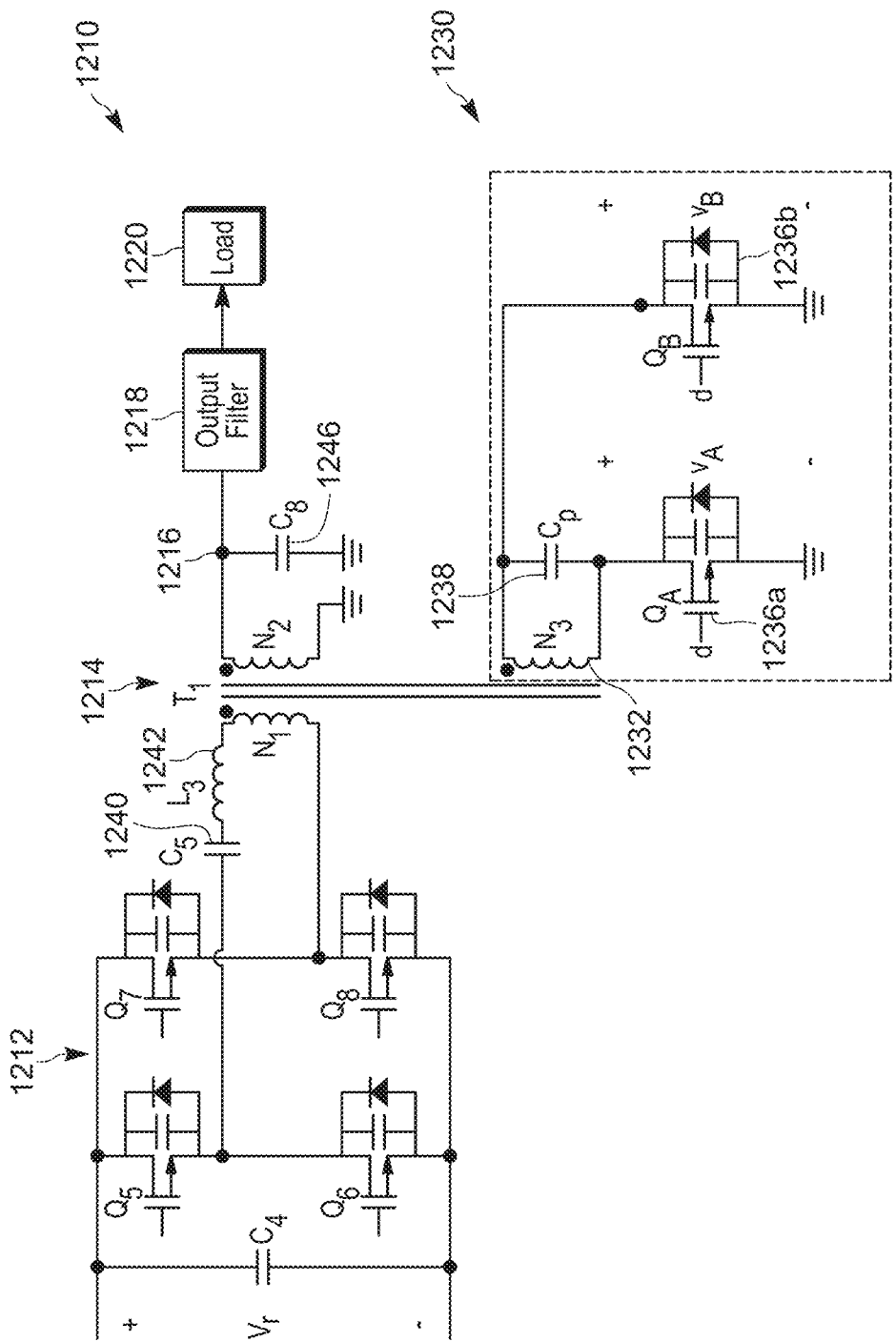
FIG. 12 shows a power amplifier having a single power amplifier and a switched variable capacitance.

With reference to FIG. 12, rectified voltage $V_r$ is input to switched capacitor modulator (SCM) or power amplifier 1210. Power amplifier 1210 includes power amplifier or inverter 1212, transformer 1214, output terminal 1216, and switch variable capacitance (SVC) 1230. Power amplifier 1212 includes switches $Q_5$, $Q_6$, $Q_7$, $Q_8$ that receive RF drive signals that control the respective switches. Operation of respective switches in a particular matter, generates an RF output signal. SVC 1230 operates to provide a switched variable impedance at output terminal 1216. Varying the capacitance as described herein varies the impedance at output terminal 1216. Power amplifier 1212 receives a DC input signal $V_r$ (generated in one of FIGS. 9-11) and outputs an AC signal to an output filter including capacitor $C_5$ 1240 and inductor $L_3$ 1242. The AC (or RF) signal is applied to the primary winding $N_1$ of transformer 1214, and a RF signal is transformed to the secondary winding $N_2$ of transformer 1214 and output terminal 1216. Load capacitor $C_8$ 1246 includes a first terminal connected to ground and a second terminal connected to output terminal 1216. Output filter 1218 connects to output terminal 1216 and generates an AC signal to load 1220. As shown in FIG. 12, power amplifier 1210 implements a single class-D power amplifier and a switched variable capacitance (SVC). The switched variable capacitance is implemented using bidirectional switches $Q_A$, $Q_B$ (1236a, 1236b), and a fixed capacitor $C_P$ 1238 connected to the terminals of tertiary winding 1232 of transformer 1214. Bidirectional switches $Q_A$, $Q_B$ each control one half cycle of the AC voltage across capacitor $C_P$ 1238. Each switch $Q_A$, $Q_B$ generates a respective first output voltage signal or first output voltage $V_A$ and second output voltage signal or second output $V_B$ and the voltage is applied to a respective terminal of capacitor $C_P$ 1238.

An equivalent switch capacitance $C_v$ of the switch variable capacitances is formulated at the fundamental frequency of the power amplifier as shown in Equation (1):

$$C_v = \frac{C_p}{1 - 2d + \frac{1}{\pi}(2\pi d)\cos(2\pi d)} \text{ for } 0 \le d_{\textit{eff}} < 0.5 \qquad (1)$$

Where:
  $C_v$ is the equivalent capacitance;
  $C_p$ is the value of capacitor $C_P$ 1238; and
  $d_{\textit{eff}}$ is the switching effective duty cycle of operation of switches $Q_A$, $Q_B$ (where d is less than 0.5 or 50%).

Although shown and described in Equation 1 as an equivalent capacitance, it will be understood that a capacitance may be generally described as a reactance, and a variable capacitance is a variable reactance, which varies in impedance. In other configurations, a variable reactance can be provided by varying the characteristics of an inductor, and that the SCM described herein can be included as a variable inductance that varies a reactance to vary the impedance at the output terminal. In various other configurations, some combination of capacitance and inductance may varied to effect create a variable reactance and a resulting variable impedance at the output terminal.

Figure 13:
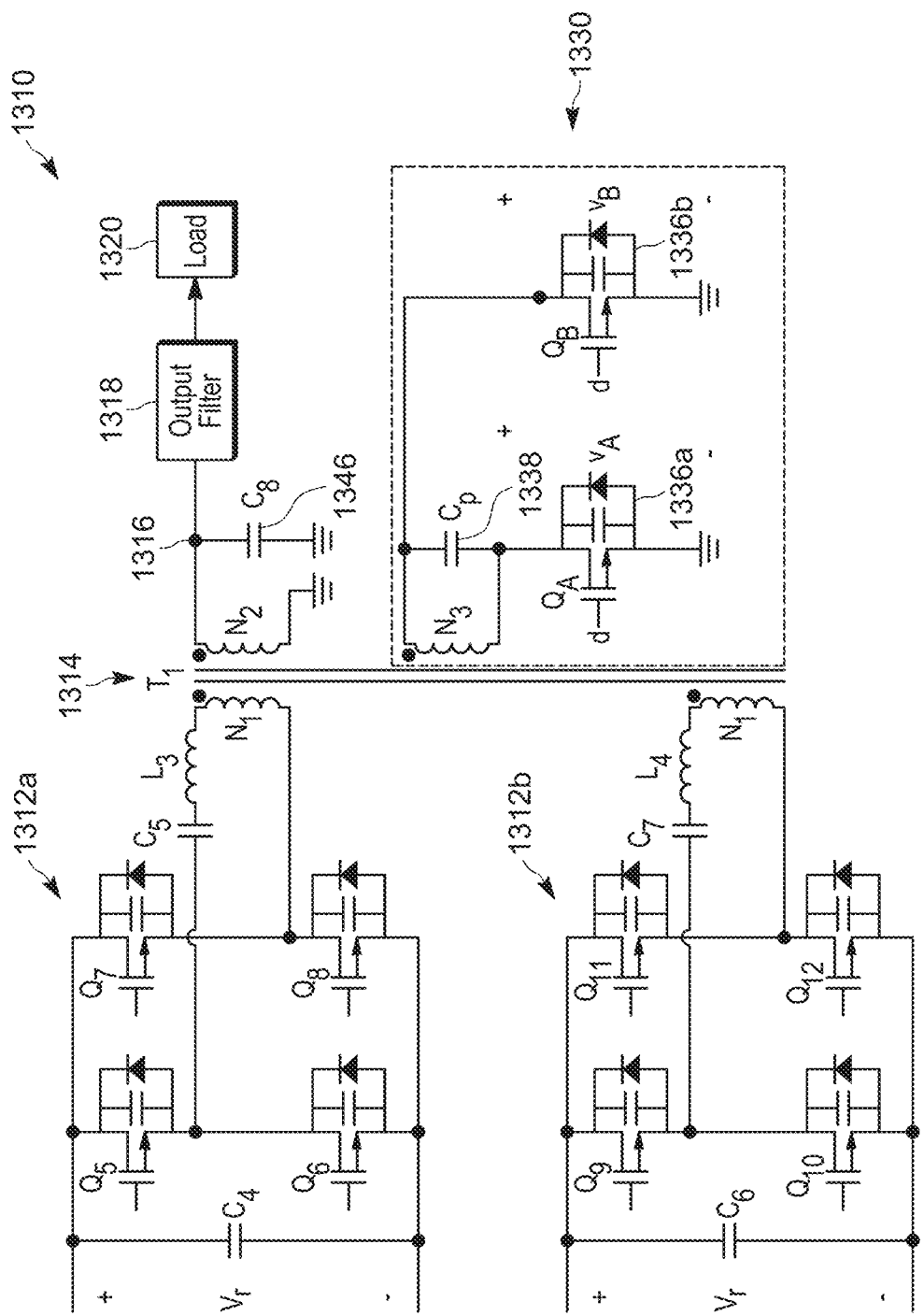
FIG. 13 shows a power amplifier including a pair of power amplifiers and a switched variable capacitance.

FIG. 13 shows a SCM or power amplifier 1310 having a pair of power amplifiers 1312a, 1312b. Each power amplifier 1312a, 1312b receives the rectified voltage $V_r$ generated as described above with respect to FIGS. 9-11. Power amplifiers 1312a, 1312b can be outphased as described above, such as with with respect to FIGS. 5 and 7 to vary the amplitude of the RF voltage at output terminal 1316. SCM or power amplifier 1310 also includes a SVC 1330, which operates as described above with respect to FIG. 12.

Figure 14:
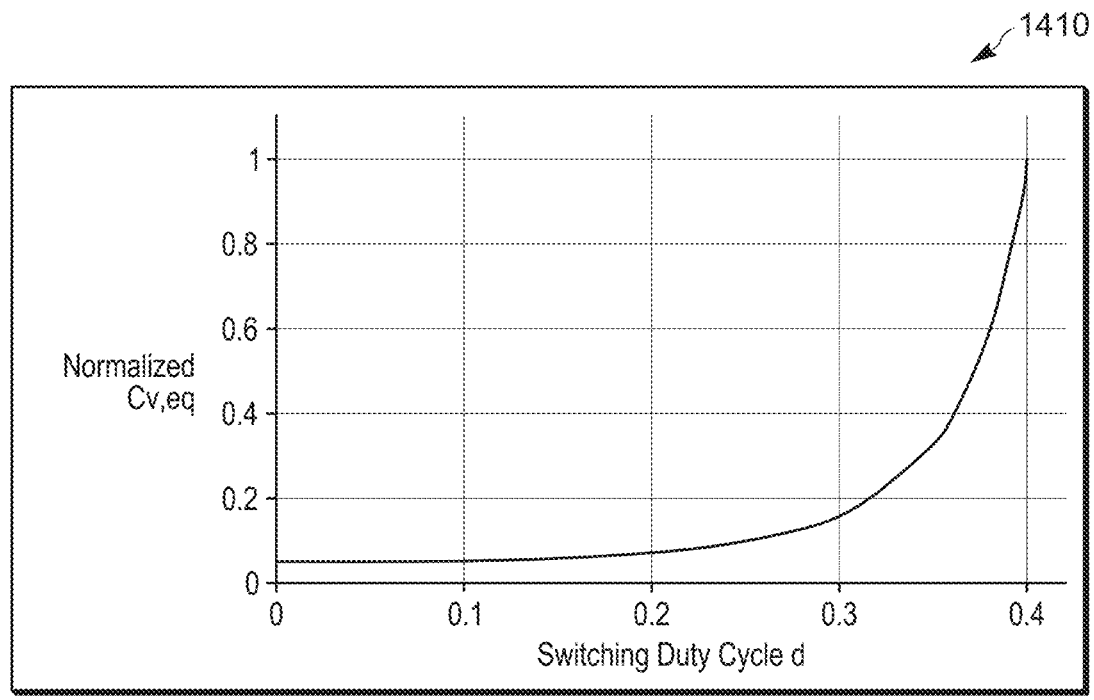
FIG. 14 shows a plot of equivalent capacitance of the switched variable capacitance relative to the switching duty cycle of operation of the switches of the switched variable capacitance.
Figure 15:
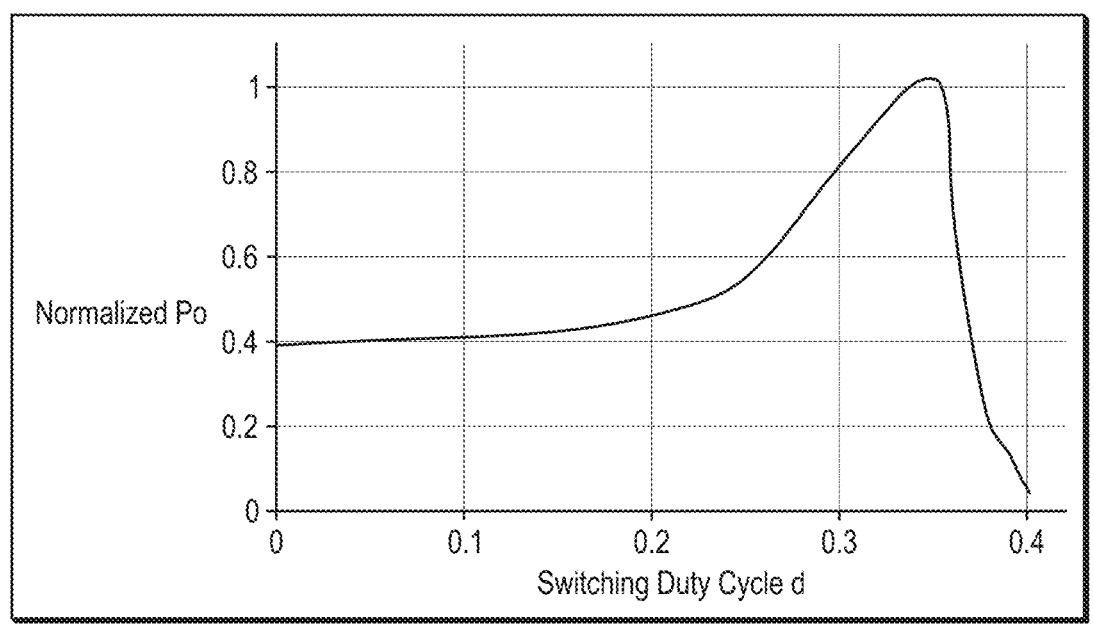
FIG. 15 shows a plot of normalized power output relative to the switching duty cycle of operation of the switches of the switched variable impedance.

FIGS. 14 and 15 show waveforms that indicate the respective normalized equivalent capacitance $C_V$ and a normalized power output $P_0$, respectively, versus effective duty cycle d. As can be seen in FIG. 14, the normalized equivalent capacitance increases from slightly above zero at a duty cycle of 0 to approximately 1 at a duty cycle of 0.4. Thus, a change in the normalized equivalent capacitance $C_V$ results in a change in the switch variable impedance provided by SVCs 1230, 1330 of respective FIGS. 12 and 13. As described above the SVC controls a switched variable impedance in parallel with capacitor $C_8$ (1246, 1346) and thereby enables variation of power at output terminal 1316. Thus, the SCM or class-D power amplifiers of FIGS. 12 and 13 operate to include a variable load, where the load varies in accordance with a switched variable impedance which in turn varies in accordance with the duty cycle control-d of SVC (1230, 1330).

FIG. 15 shows the variation in normalized output power $P_0$ with respect to the switching effective duty cycle d. As can be seen in FIG. 15, from a duty cycle of 0 to approximately 0.2, the normalized power $P_O$ increases minimally around 0.4. From an effective duty cycle of 0.2 to approximately 0.34, normalized power $P_O$ increases to approximately 1. The normalized power $P_O$ drops off relatively quickly when effective duty cycle-d increases from approximately 0.34 to 0.4. FIG. 15 thus indicates that the output power $P_O$ can be well regulated by controlling SVCs 1230, 1330. Thus, the RF output load power at the output terminals 1216 or 1316, can be regulated by a (1) conventional switch control of one inverter as shown in FIG. 12 or phase control between two power amplifiers 1312a, 1312b as shown in FIG. 13 and (2) the switching duty cycle-d of SVCs 1230, 1330, which modifies the output load impedance. FIG. 14 shows a generalized example without operating conditions. FIG. 15, by way of comparison, shows a specific, nonlimiting example at a specific supply voltage, load conditions, and operating frequency.

Figure 16:
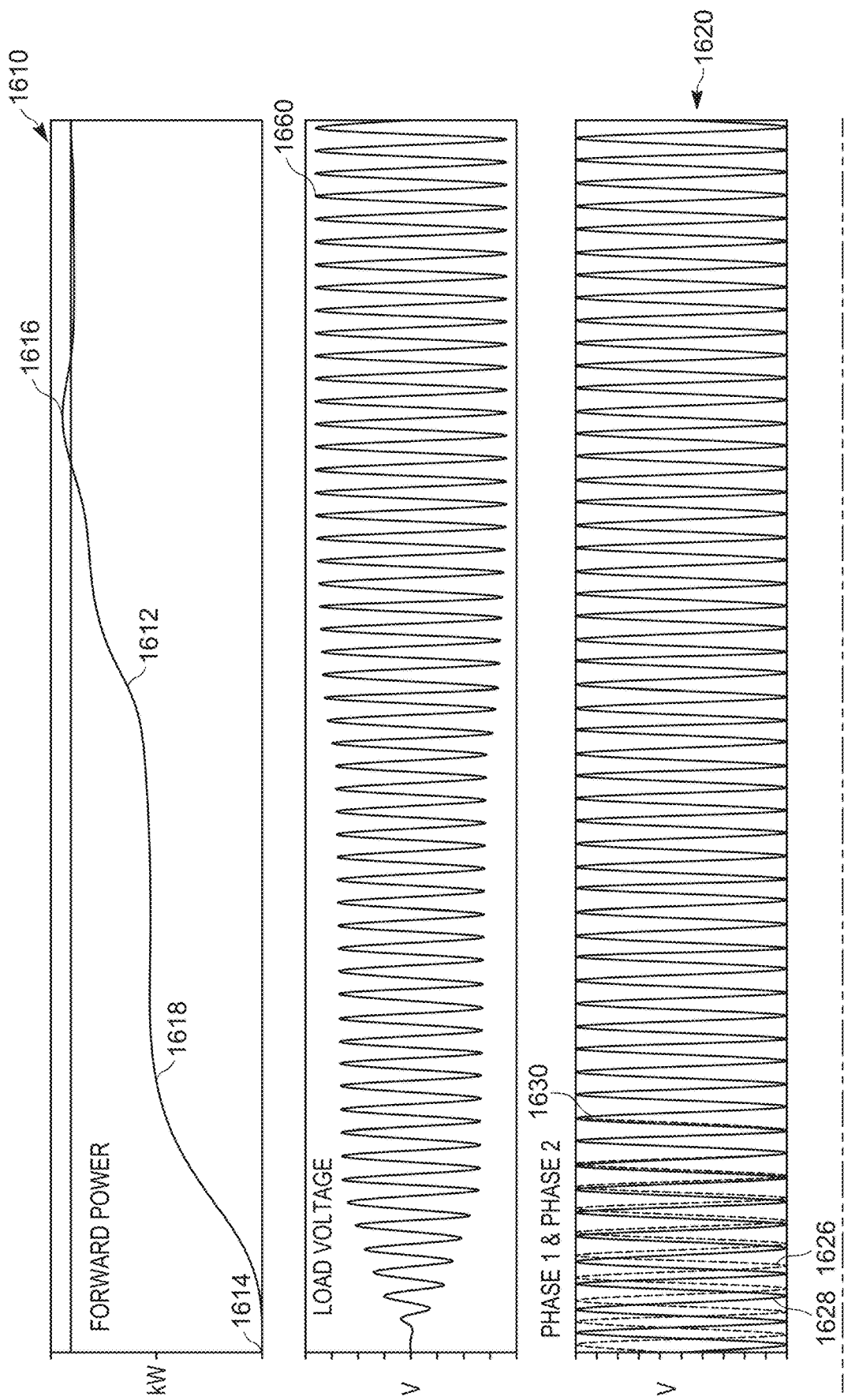
FIG. 16 shows waveforms for a power amplifier having a switched variable capacitance.
Figure 16:
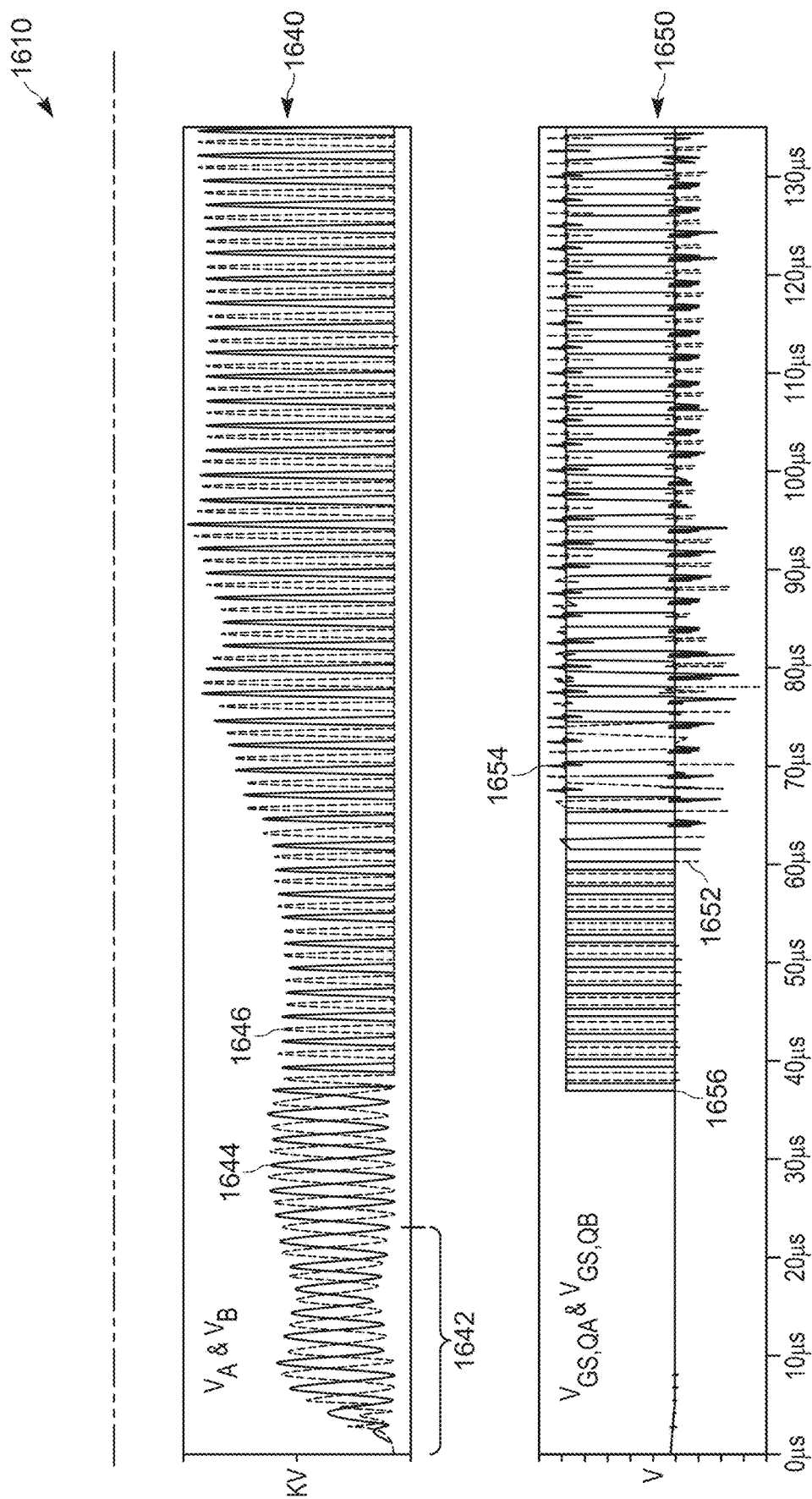

FIG. 16 shows nonlimiting examples of waveforms describing operation of a SCM or power amplifier described herein. The waveforms of FIG. 16 show operation of a dual power amplifier, or dual inverter, power amplifier 1310, such as shown in FIG. 13. By way of nonlimiting example, the power amplifier 1310 may have a power setpoint of 5 kW, a frequency of 400 kHz, and a voltage standing wave ratio (VSWR) of 1 at 50 ohms. As shown at waveform 1612, power is controlled from 0 at 1614 to a maximum at 1616.

Waveforms 1620 indicate the phases at which inverters or power amplifiers 1312a, 1312b of FIG. 13 are operated. Waveform 1626 indicates the phase of power amplifier 1312a, and waveform 1628 indicates the phase of power amplifier 1312b. As shown at approximately 1630, the phase of power amplifiers 1312a, 1312b become the same so that only one phase appears to be shown after 1630. Thus, to increase the output power, the controller moves the phase from 180 degrees out-of-phase to nearly in-phase.

When applying phase control to power amplifiers 1312a, 1312b, the output voltage increases from 1614 to 1618. Phase control initially increase the voltage to point 1618, and SVC control further increases the output voltage. By setting a phase threshold, the SVC control will be active when the phase transitions to less than or equal to the threshold. Waveforms 1640 indicate the voltage across respective switches 1336a, 1336b. As will be described in greater detail, control of switches 1336a, 1336b is in part determined based upon zero crossing of voltages $V_A$ and $V_B$ and, therefore, voltages $V_A$ and $V_B$ must be sufficiently high in order to detect zero crossing. Waveform 1644 indicates voltage $V_A$, and waveform 1646 indicates voltage $V_B$. Voltages $V_A$ and $V_B$ of waveform 1640 increase in region 1642. Waveforms 1650 indicate the gate to source voltages $V_{GS}$ for switches 1336a, 1336b. Waveforms 1650 represent the duty cycle driving switches 1336a, 1336b, with waveform 1652 representing the drive signal applied to switch $Q_A$ 1336a and waveform 1654 representing the drive signal applied to switch $Q_B$ 1336b. As is also shown at 1650, switches $Q_A$, $Q_B$ are not activated until time 1656, after which voltage (forward power) continues to increase up to time 1616. In various nonlimiting examples, as shown at FIG. 16, power is well regulated using phase control and duty cycle control so that the forward voltage (power) is reached within approximately 100 microseconds as shown at 1616. Waveform 1660 shows the load voltage.

Figure 17:
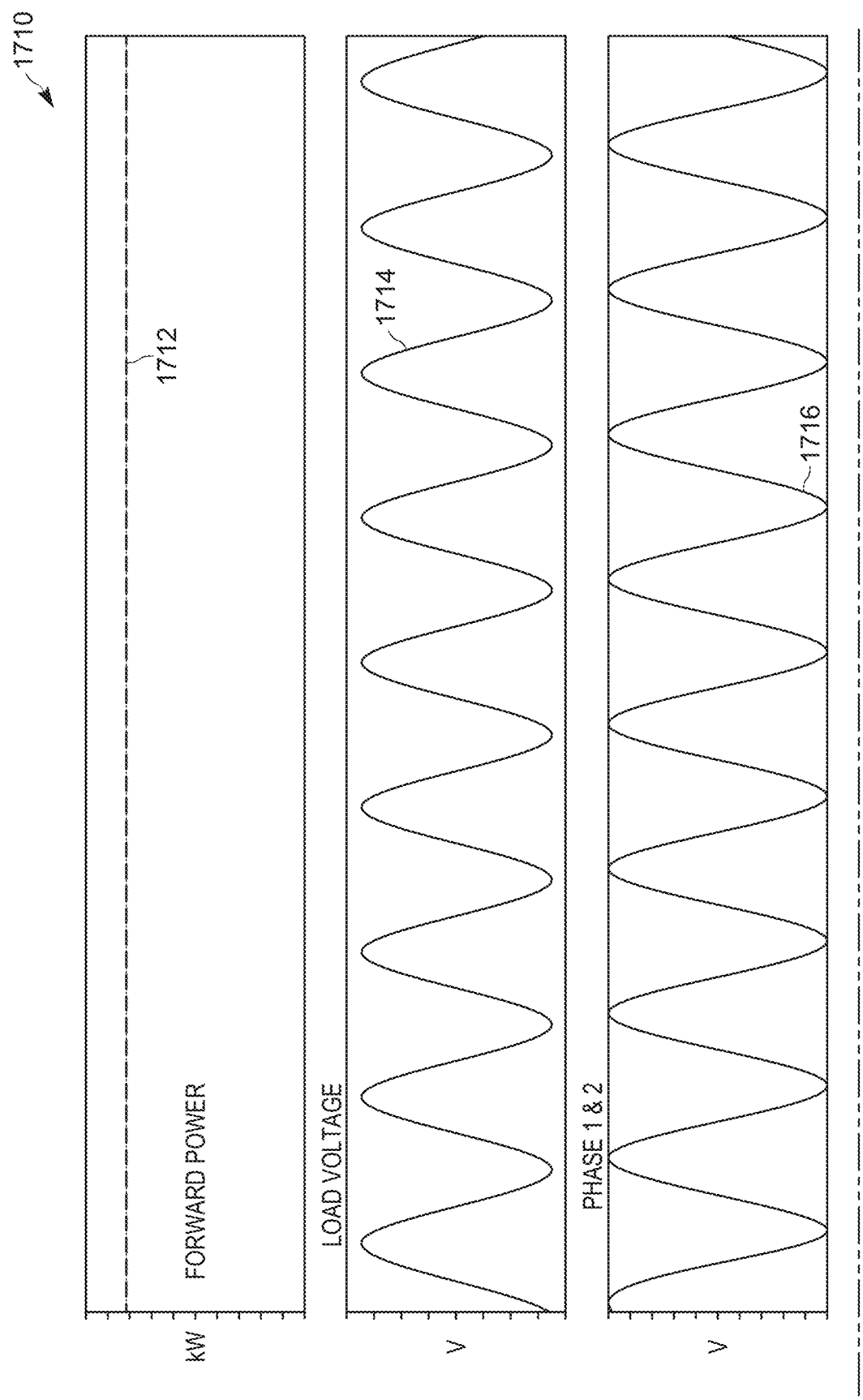
FIG. 17 shows an expanded view of a portion of FIG. 16 waveforms.
Figure 17:
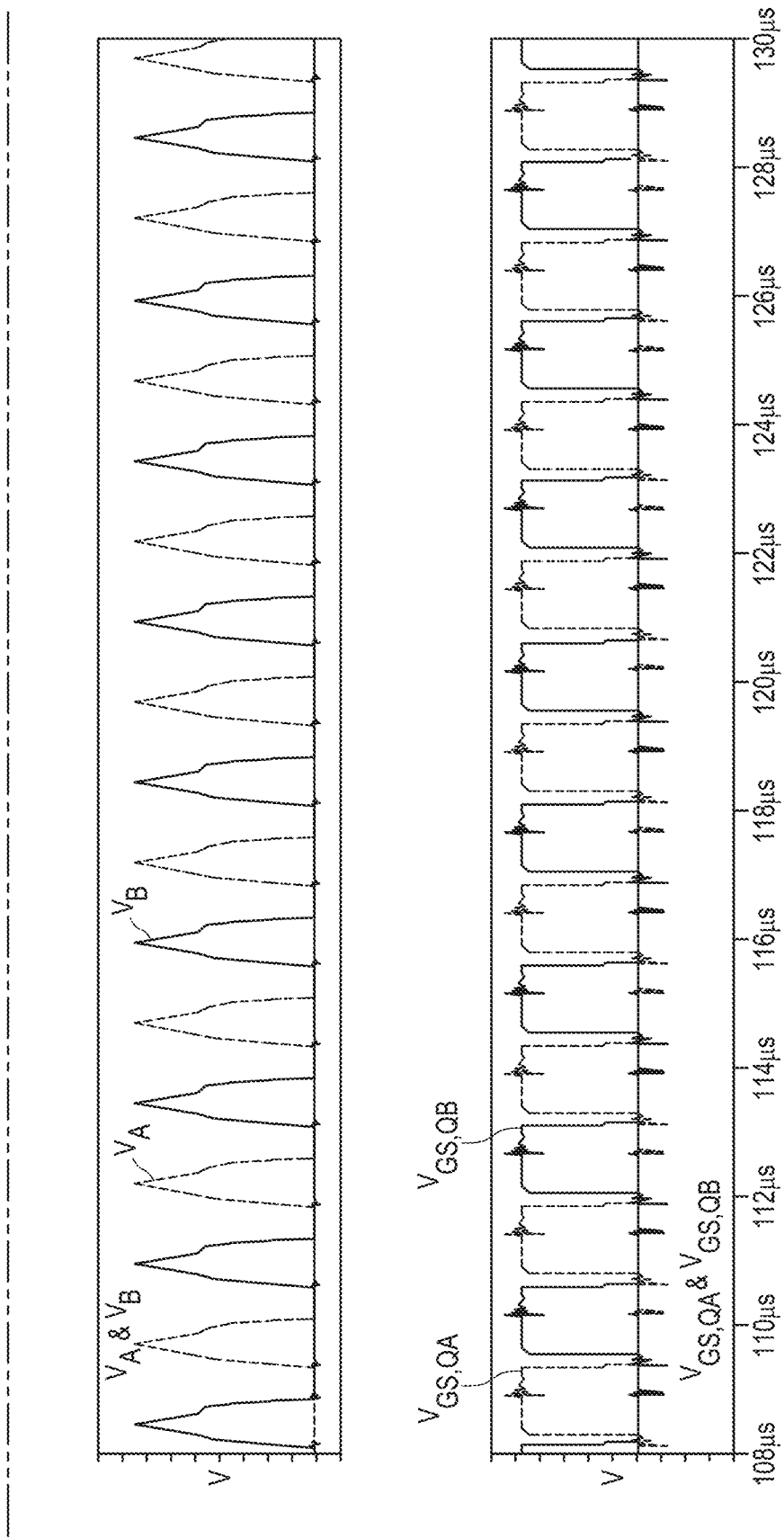

FIG. 17 shows waveforms 1710 representing an expanded view of the waveforms of FIG. 16 between 108 µs-130 µs. FIG. 17 represents a portion of FIG. 16 beyond which power has already been maximized, as shown at waveform 1712.

Similarly, load voltage 1714 and phase 1 and phase 2 1716 are also operating in a generally stable area of FIG. 16. With further reference to FIG. 17, switches $Q_A$, $Q_B$ are driven generally out of phase, and as the voltage across one of the switches $Q_A$, $Q_B$ approaches zero, the switch $Q_A$, $Q_B$ turns on, after a predetermined delay. Each switch is thus activated in accordance with a zero crossing of voltage $V_A$, $V_B$ to turn on the respective switch $Q_A$, $Q_B$ associated with the voltage $V_A$, $V_B$. Voltages $V_{GS}$, $Q_A$ and $V_{GS}$, $Q_B$ represent the gate voltage that turns on respective switches $Q_1$, $Q_2$.

In various configurations, the control approaches described herein can be implemented using various devices and various control approaches. By way of nonlimiting example, electronic variable capacitors (EVC) can be implemented using diodes and reverse bias to vary the capacitance. Further, a discrete switch capacitor may be formed by combining multiple switches. Further yet, pin diodes can be used to further vary the impedance. In other configurations, a switched variable inductor can be used to vary the equivalent inductance. Various control approaches can include a single phase control to control power instead of phase and duty cycle.

Figure 18:
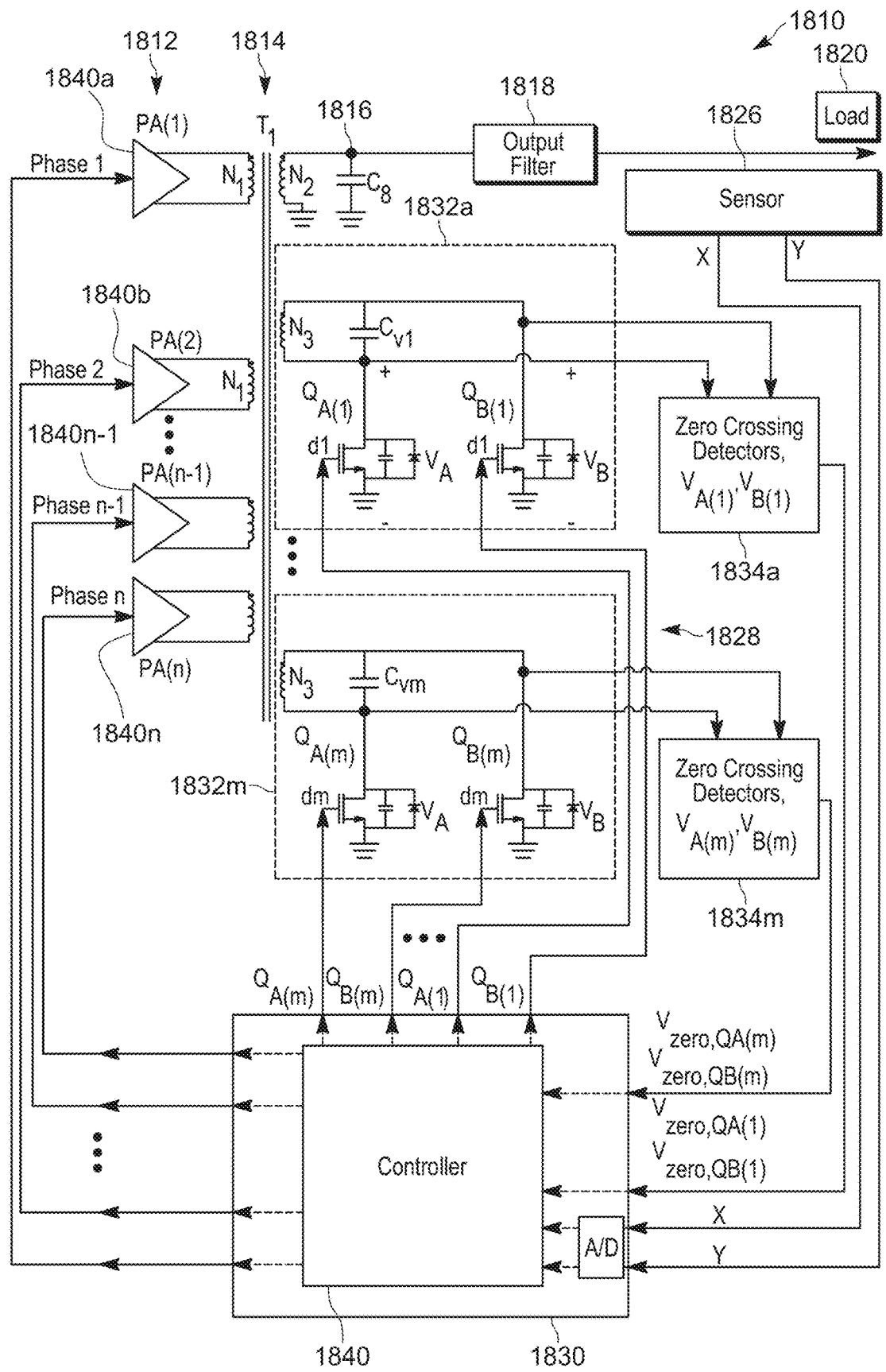
FIG. 18 shows a partial schematic and block diagram of a power amplifier and control system modulator where multiple power amplifiers are arranged in parallel.
Figure 19:
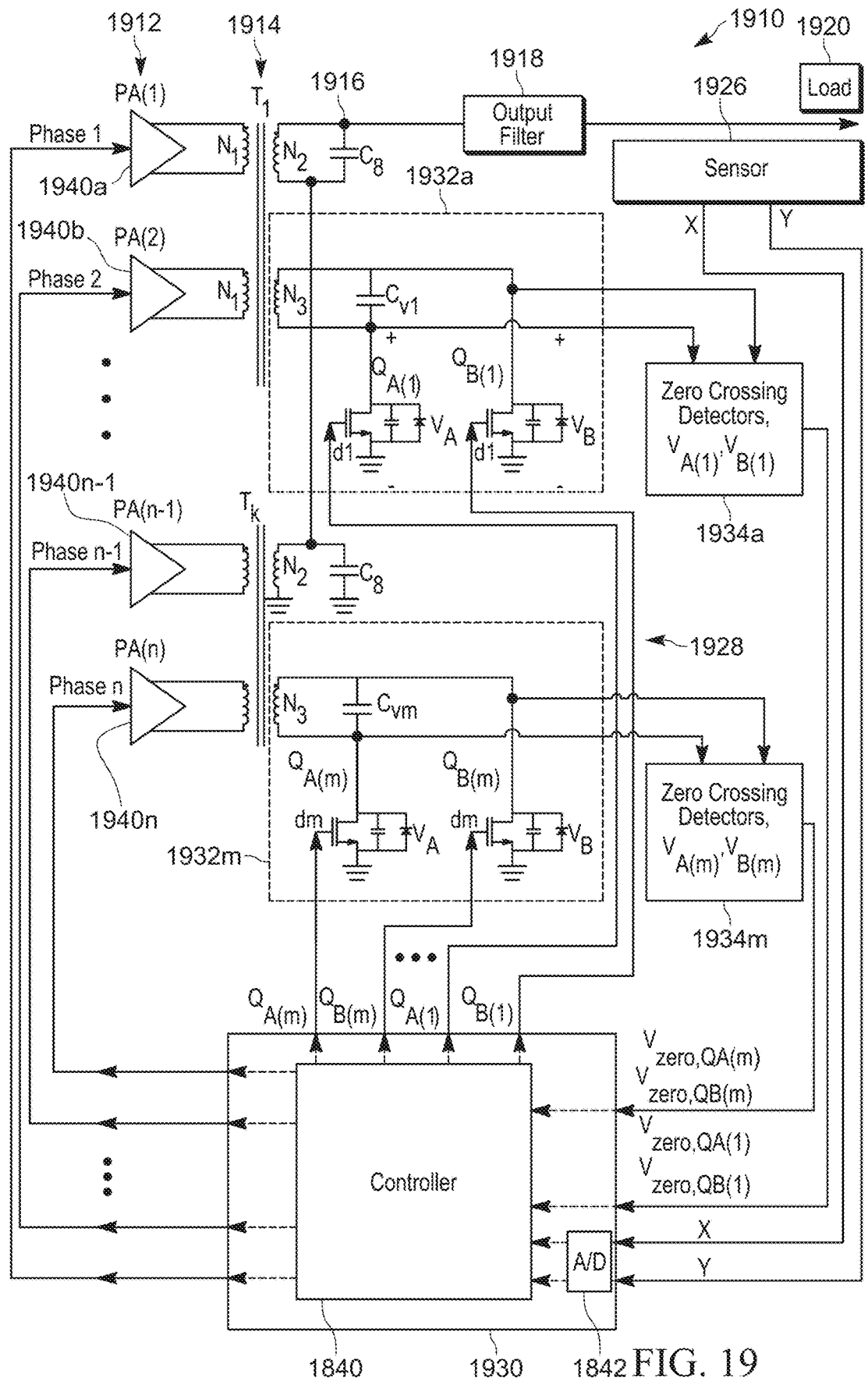
FIG. 19 shows a partial schematic and block diagram of a power amplifier and control system where multiple power amplifiers are arranged in series.

FIG. 18 shows a block diagram of a RF generator 1810 including a SCM or power amplifier having multiple power amplifiers and SVCs arranged in parallel, and FIG. 19 shows a block diagram of a RF generator 1910 including a SCM or power amplifier 1910 having multiple power amplifiers arranged in series. Throughout the description of FIGS. 18 and 19, like reference numerals will refer to similar elements with 18 preceding elements referred to FIGS. 18 and 19 preceding elements referred to in FIG. 19. FIGS. 18 and 19, include a power amplifier section 1812, 1912 connected to primary windings $N_1$ of a transformer 1814, 1914 to provide an RF signal at output terminal 1816, 1916. RF signal at output terminal 1816, 1916 is applied to output filter 1818, 1918, and the RF output signal is applied to load 1820, 1920. Sensor 1826, 1926 detects output voltage and current or forward and reverse power and generates sense signals X, Y to controller 1830, 1930. RF generator 1810 also includes a plurality of SVCs 1832a, ..., 1832m; 1932a, ..., 1932m representing up to m SVCs. Controller 1830, 1930 also receives input from zero cross or zero crossing detectors 1834a, ..., 1834m; 1934a, ..., 1934m which output signals indicating zero crossing of respective voltages $V_A$, $V_B$ of a respective SVCs 1832a, ..., 1832m; 1932a, ..., 1932m.

RF generator 1810, 1910 includes a plurality of power amplifiers PA(1), PA(2), ..., PA (n in power amplifier section 1812, 1912). Each power amplifier may be arranged as described above, such as with respect to FIGS. 12 and 13. Each power amplifier 1840a, ..., 1840n; 1940a, ..., 1940n receives a rectified voltage $V_R$ and outputs a RF signal that varies in accordance, a phase between power amplifiers 1840a, ... 1840n; 1940a, ..., 1940n. Each amplifier receives a respective phase signal which determines one or both of operating phase for the legs of the inverter and phases between the inverters as well.

Control of power amplifier section 1812, 1912 and SVC section 1830, 1930 carried out by RF generator controller 1830, 1930. RF generator controller 1830, 1930 includes a controller 1836, 1936 which receives various inputs and generates various outputs. Inputs to controller 1836, 1936 include signals output from respective zero crossing detectors 1834a, ..., 1834m; 1934a, ..., 1934m. Each zero crossing detector 1834a, ..., 1834m; 1934a, ..., 1934m outputs a signal indicating when the voltage across respective switches $Q_{A(1)}$, $Q_{B(1)}$, ..., $Q_{A(m)}$, $Q_{B(m)}$ approaches zero. Thus, each zero crossing detector indicates when the associated switch $Q_A$, $Q_B$ approaches zero volts across the switch.

As described above, sensor 1826, 1926 outputs signals X, Y which vary in accordance with a particular detection method, such as voltage/current or forward power/reverse power, generally described as signals X, Y, input to analog to digital (A/D) converter 1842, 1942. Digital output from A/D converter 1842, 1942 is input to controller 1836, 1936. Controller 1836, 1936 generates control signals to control the phases of respective power amplifiers 1836, 1936 of amplifier section 1812, 1912. Controller 1836, 1936 also outputs gate drive signals to respective SVC 1832, 1932. In particular, the drive signals are generated in pairs, with one pair applied to each switch $Q_A$, $Q_B$ of each respective SVC 1832, 1932.

As can be seen in FIG. 18, the plurality of power amplifiers in power amplifier section 1812 are arranged in parallel. Similarly, the plurality of SVCs 1832 are arranged in parallel with output terminal 1816. FIG. 19, on the other hand, indicates a plurality of transformers $T_1, T_2, \ldots, T_k$ in transformer section 1914 $T_1, T_2, \ldots, T_k$. Each transformer includes a secondary winding $N_2$, and the secondary windings are arranged in series, between the secondary winding associated with transformer $T_k$ connected to ground and output terminal 1916.

As described above, switches $Q_{A(1)}$ and $Q_{B(1)}$ are operated at or near zero voltage switching (ZVS) conditions. In order to effect ZVS, zero crossing detectors 1834, 1934 detect zero voltage between the drain and source, voltages $V_A$, $V_B$, respectively. Zero crossing detectors 1834, 1934 convert the sinusoidal input to a square wave output input to controller 1836, 1936 as $V_{zero}$, $Q_{A(1)}$, $V_{zero}$, $Q_{B(1)}$; ...; $V_{zero}$, $Q_{A(m)}$, $V_{zero}$, $Q_{B(m)}$. In various configurations, one or both of the voltages across respective switches $Q_A$, $Q_B$ may be detected in order to effect the ZVS. That is, a single zero crossing detection can be used to control both switches $Q_A$, $Q_B$, or a pair of zero crossing detections can be used to control switches $Q_A$, $Q_B$ independently. In various other configurations, a single zero-crossing $V_{zero}$, $Q_{A(x)}$ or $V_{zero}$, $Q_{B(x)}$, where x may be any of 1, ..., m, may be used to infer zero-crossings in all m SCMs, or a single pair of $Q_{A(y)}$, $Q_{B(y)}$, where y is any of 1, ..., m, may be used to control all m SCMs. In various configurations, switches $Q_{A(x)}$ and $Q_{B(x)}$, where x is any of 1, ..., m, can be operated in accordance with a respective, detected $V_{A(x)}$ and $V_{B(x)}$, and a single detected voltage $V_{y(x)}$, where y is any of 1, ..., m, can be used to determine operation of one or any plurality of $Q_{A(x)}$ or $Q_{B(x)}$.

Figure 20:
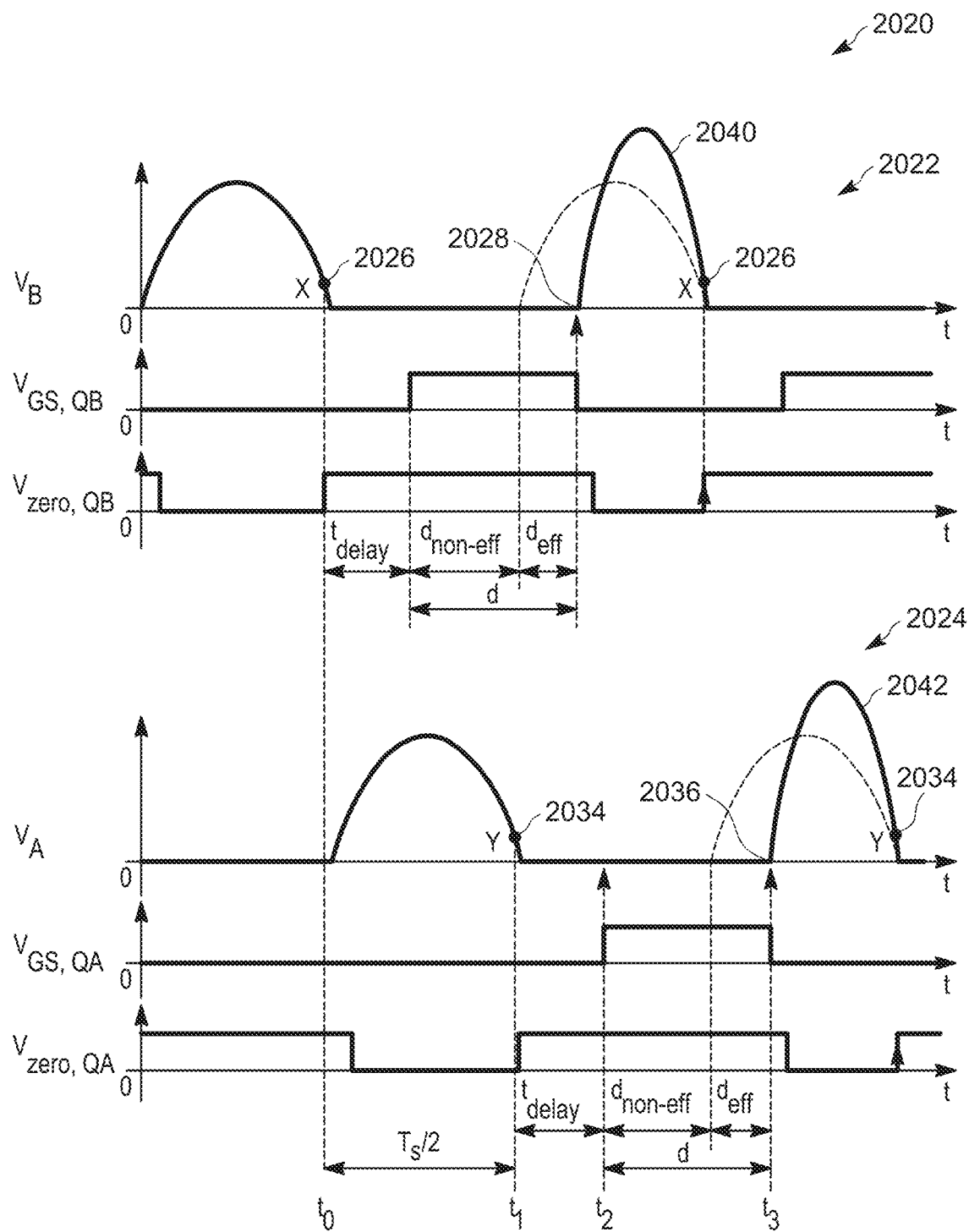
FIG. 20 shows waveforms describing operation of a switched capacitor modulator.

FIG. 20 shows waveforms 2020 describing controlling switches $Q_A$, $Q_B$ of an SVC. Waveforms 2022 describe controlling switch $Q_B$, and waveforms 2024 describe controlling switch $Q_A$. With respect to waveforms 2022, as voltage $V_B$, the voltage across switch $Q_B$, approaches zero, as shown at point X 2026, the zero cross or zero crossing signal $V_{zero}$, $Q_B$ transitions high as shown at time to. At the indication of a zero cross, such as at to for switch $Q_B$, a series of delays are introduced. Once a controller detects a rising edge of $V_{zero}$, $Q_B$, a time delay $t_{delay}$ is initiated to allow sufficient time to pass to allow switch $Q_B$ to turned on only after the voltage $V_B$ has reached zero. After delay $t_{delay}$, a controller turns on a gate drive signal $V_{GS}$, $Q_B$ to begin turn on of switch $Q_B$.

Although the gate drive signal is initiated after $t_{delay}$, a further delay d passes prior to $V_B$ increasing from zero as shown at 2028. Delay d includes both a noneffective and an effective delay so that $d=d_{non\_eff}+d_{eff}$. The noneffective delay $d_{non\_eff}$ is an ineffective period because the voltage $V_B$ is zero does not change the equivalent capacitance CB. The delay $d_{eff}$ is an effective period which equals the switching duty cycle d as described above in Equation (1) for $C_V$ above as the voltage $V_B$ is nonzero.

Waveforms 2024 describe a similar operation for switch $Q_B$. At location Y 2034, the zero crossing is detected and indicated by a transition of $V_{zero}$, $Q_A$ from low to high. After the combined delay of $t_{delay}$ and d the voltage of $V_A$ across switch $Q_A$ begins to rise from zero as shown at 2036 following the turn on of switch $Q_A$ by applying a gate to drive signal $V_{GS}$, $Q_A$ after the delay $t_{delay}$. In various configurations, a single zero crossing signal $V_{zero}$, $Q_B$ (or $V_{zero}$, $Q_A$), can be used to control timing for both $V_{GS}$, $Q_A$ and $V_{GS}$, $Q_B$ in accordance with a timing delay of a period of operation of $V_{GS}$, $Q_B$ divided by two. It should be noted that waveforms 2040, 2042 indicate the respective power increases from operating the SVC in a manner described herein.

Figure 21:
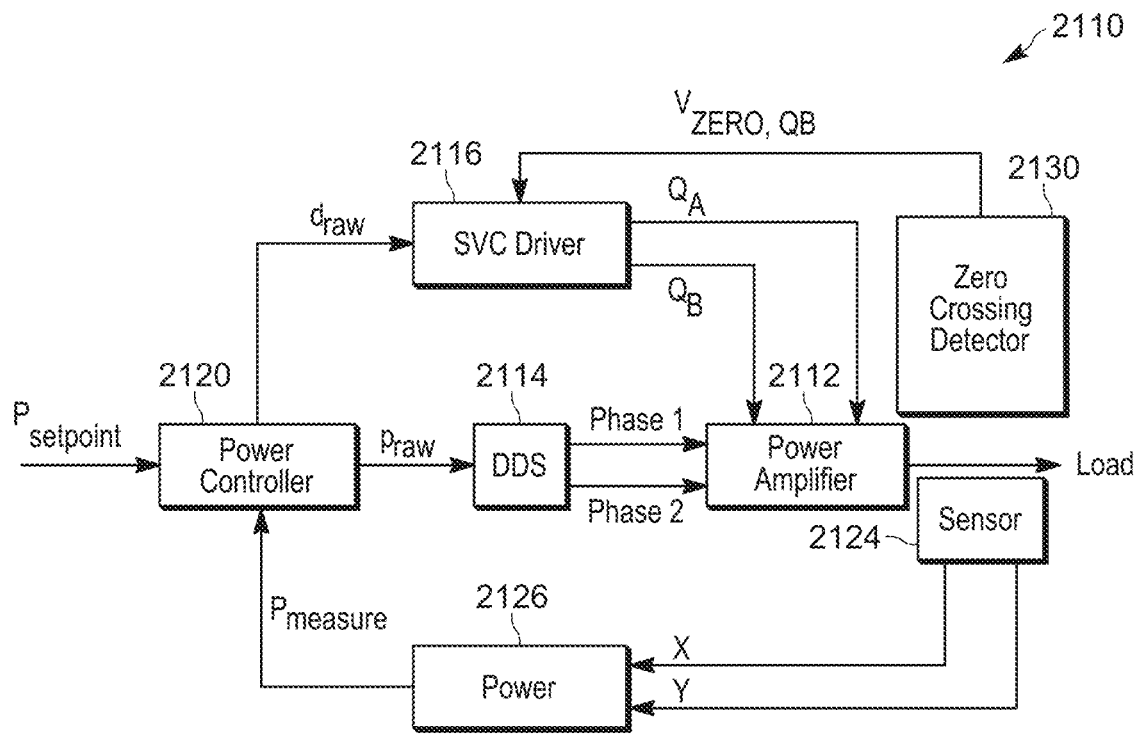
FIG. 21 shows a block diagram of a power amplifier using a switched capacitor modulator and operated in a continuous wave mode of operation.

FIG. 21 shows a block diagram for a RF generator 2110 configured to include the SCM or power amplifiers as described above. Power amplifier 2112 is controlled by input phase and driver signals determined by respective direct digital synthesizer (DDS) 2114 and SVC driver 2116. Power controller 2110 outputs a commanded duty cycle $d_{RAW}$ and $p_{RAW}$ to respective SVC driver 2116 and DDS 2114. Power controller 2020 receives a power setpoint $P_{setpoint}$ which represents a desired power setpoint to be output by power amplifier 2112 to the load. A sensor 2124 operates as described above to output sense signals X, Y to power module 2126. Power module 2126 receives the sense values X, Y and outputs a measured power value $P_{measure}$ to controller 2120. Power controller 2120 determines desired, commanded duty cycle $d_{RAW}$ and phase $p_{RAW}$ in accordance with a difference between $P_{setpoint}$ and $P_{measure}$.

The commanded values output by controller 2110 $d_{RAW}$ and $p_{RAW}$ input to respective SVC driver 2116 and DDS 2114 represent commanded signals. By way of nonlimiting example, SVC driver 2116 receives the commanded duty cycle $d_{RAW}$ and generates actuator signals applied to $Q_A$ and $Q_B$ of a SVC in power amplifier 2112. SVC driver 2116 receives at least one zero cross signal, as described above, from zero cross detector 2130. It will be understood that zero cross detector 2130 may include one or a pair of zero crossing detectors associated with one or both of switches $Q_A$, $Q_B$. DDS 2114 receives the commanded phase $p_{RAW}$ and generates actuator signals for controlling the phase of power amplifier 2112.

Power amplifier 2112 may include one or a plurality of power amplifiers as described above. For example, the power amplifiers may be embodied as described in any of FIG. 12, 13, 18, or 19. In RF generator 2110 shown in FIG. 21, it is assumed that the relative phase between a pair of inverters is controlled via Phase1 and Phase2 output by DDS 2114. However, if multiple dual inverter power amplifier configurations are used, multiple sets of phase signals are input to power amplifier 2112. Likewise, if power amplifier 2112 includes multiple sets of SVCs, multiple sets of gate drive signals $Q_A$ and $Q_B$ are input to power amplifier 2112. In the case of power amplifier 2112 configured as a signal power amplifier, such as shown at FIG. 12, DDS 2114 outputs phase signals for controlling the switched pairs of a single inverter power amplifier. Further, in various configurations, DDS 2114 and SVC driver 2116 may be combined into a single controller, integrated into power controller 2120 or separate from power controller 2120. In various other configurations, SVC driver 2116 may comprise a single driver or a pair of drivers, where each driver controls a gate drive signal to a respective switch $Q_A$, $Q_B$.

Figure 22:
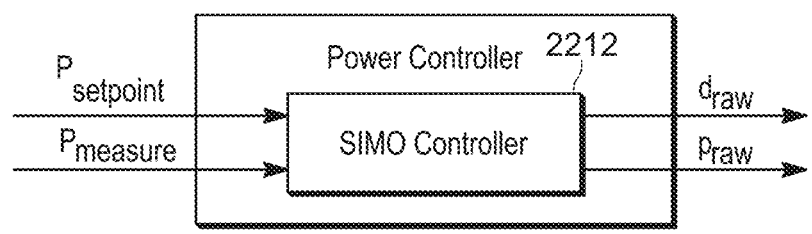
FIG. 22 shows a block diagram of a power controller for a switched capacitor modulator including a single input-multiple output (SIMO) controller.

FIG. 22 shows a generalized block diagram for a power controller 2210, such as power controller 2120 of FIG. 21. Power controller 2210 is implemented as a single input multiple output (SIMO) controller 2212 which receives an input power setpoint $P_{setpoint}$ and a measured power setpoint $P_{measure}$, and outputs a commanded duty cycle $d_{RAW}$ and phase $p_{RAW}$, as described above.

Figure 23:
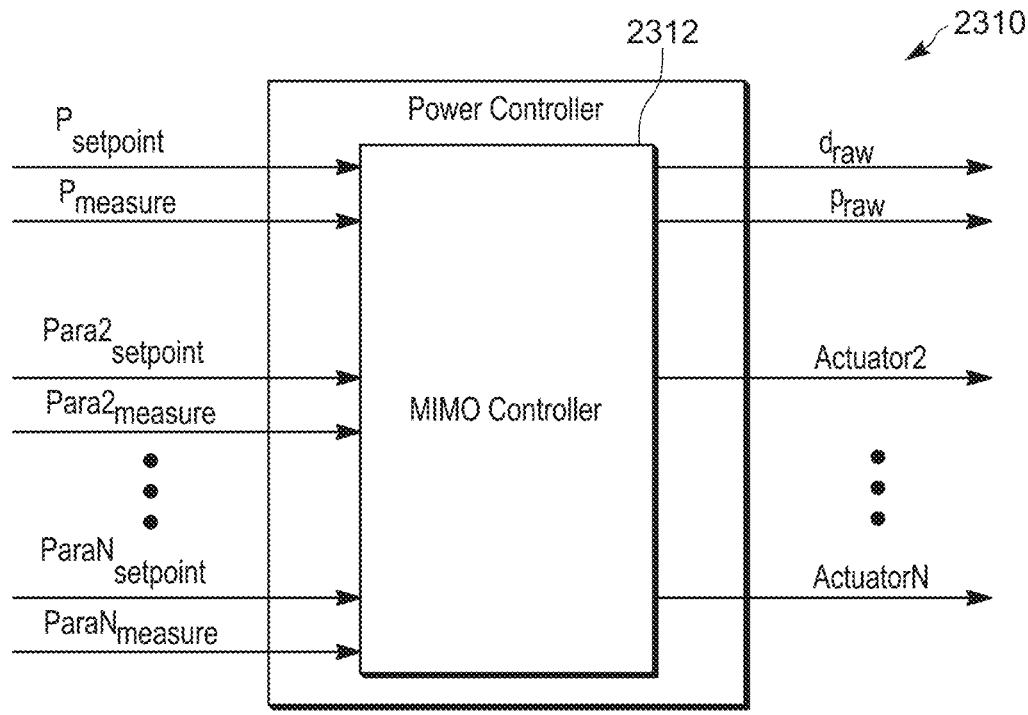
FIG. 23 shows a block diagram for a power controller for a switched capacitor modulator including a multiple input multiple output (MIMO) controller.

FIG. 23 shows a power controller 2310, such as power controller 2120 of FIG. 21. Power controller 2310 includes a multiple input multiple output (MIMO) controller 2312. In addition to receiving a power setpoint $P_{setpoint}$ and a power measured $P_{measure}$ input, MIMO controller 2312 includes a second parameter setpoint $Para2_{setpoint}$ and a measured parameter value $Para2_{measure}$. MIMO controller 2312 may receive up to N setpoints $ParaN_{setpoint}$ and measured values $ParaN_{measure}$. In various configurations, the setpoints and measured values need not appear in pairs. In various configurations, a setpoint only may be applied without a corresponding measured value or a measured value only may be input without a corresponding setpoint. Input parameters may include impedance reflection coefficient, RF frequency, RF signal phase, rail voltage, delivered power, VSWR, pulse state, operating parameters, sync signals from external RF generators, voltage, and current.

MIMO controller 2312 generates a commanded duty cycle $d_{RAW}$ and a commanded phase $p_{RAW}$ as described above. In various configurations, MIMO controller 2312 may also output additional control outputs, Actuator 2, . . . , ActuatorN. Additional outputs may be commanded values converted to control actuation signals or may be actual actuation signals. The output actuators can include match network control commands, RF source bias commands, and RF frequency. Likewise, with respect to duty cycle and phase, the controllers described herein, such as in connection with FIGS. 21, 22, and 23, may in various configurations output an actuator control signal rather than a commanded control signal later converted to an actuator control signal.

Figure 24:
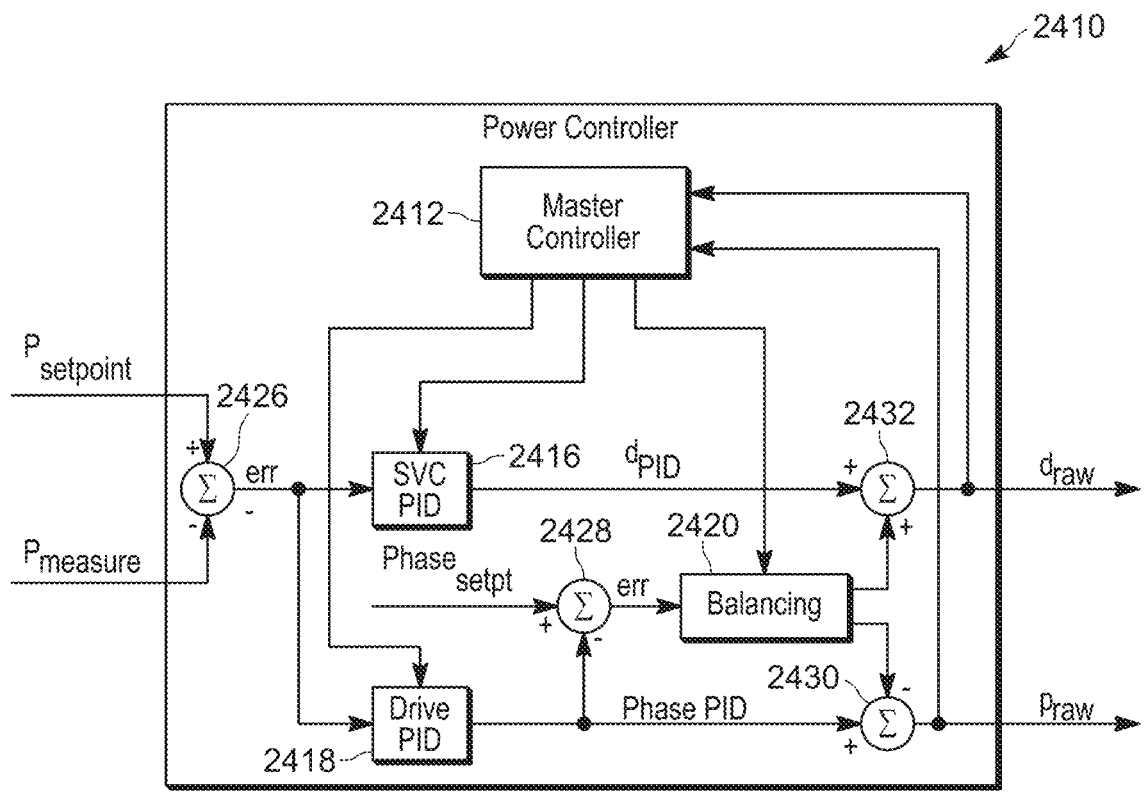
FIG. 24 shows an expanded block diagram of the power controller of FIG. 22.

FIG. 24 shows an expanded block diagram of a power controller 2410. Power controller 2410 may implement as any of the power controllers described above, such as power controllers 2120, 2210, 2310. Power controller 2410 of FIG. 24 shows an expanded block diagram of a power controller according to one nonlimiting example. Power controller 2410 includes a master controller 2412 and independent PID controllers SVC PID controller 2416 and drive PID controller 2418. Power controller 2410 also includes a balancing module or controller 2420. Master controller 2412 receives the commanded duty cycle $d_{RAW}$ and phase $p_{RAW}$ output by power controller 2410 and input to master controller 2412. Master controller 2412 generates control signals to structurally actuate one or more of SVC PID controller 2416, drive PID controller 2418, and balancing controller 2420 in accordance with the received $d_{RAW}$ and $p_{RAW}$.

Power controller 2410 receives a power setpoint $P_{setpoint}$ and a measured power $P_{measure}$ which are input to a summer 2426. Summer 2426 determines a difference between the setpoint and the measured value to output an error value err input to SVC PID controller 2416 and drive PID controller 2418. Based on the error err, SVC PID controller 2416 outputs an initial duty cycle $d_{PID}$. Similarly, drive PID controller 2418 receives the error signal err and generates phase PID signal to a pair of summers 2428 and 2430. Summer 2428 receives the signal phase PID and the phase setpoint $Phase_{setpoint}$ and generates an error signal input to balancing controller 2420. Balancing controller 2420 and outputs balancing signals to summer 2430 and 2432. Balancing controller 2420 is a less reactive controller and nudges the phase toward $Phase_{setpoint}$ and $d_{RAW}$ toward an optimal value. Summer 2430 combines the phase PID signal and the balancing correction signal and generates the phase command $p_{RAW}$. Summer 2432 receives the duty cycle PID signal $d_{PID}$ and the duty cycle balancing signal and adds the two to output the commanded duty cycle $d_{RAW}$. If phase is high, balancing controller 2420 reduces phase and increases SCM duty cycle to compensate for phase reduction. If the phase is low, balancing controller 2420 increases phase and reduces SCM duty cycle. Balancing controller 2420 may be calibrated so that power does not change when it is moving towards the $Phase_{setpoint}$, because it will cause the duty cycle to move in the opposite direction. Thus, balancing controller 2420 will add to one output and subtract from another.

Master controller 2412 is configured to coordinate operation of SVC PID controller 2416, drive PID controller 2418, and balancing controller 2420. In various configurations, master controller 2412 selectively activates any one or more of SVC PID controller 2416, drive PID controller 2418, and balancing controller 2420. By way of nonlimiting example, master controller 2412 disables operation of SVC PID controller 2416, causing a zero percent duty cycle when the present phase is less than a configurable threshold value. One reason for this approach may be that at lower phase values, a zero crossing detector may not accurately detect zero crossings. In various configurations, master controller 2412 enables SVC PID controller 2416 while phase output is maintained above a configurable threshold, where the configurable threshold may be selected in accordance with reliable zero crossing detection. In various other configurations, master controller 2412 controls SVC PID controller 2416 to remain constant to allow for granular control by drive PID controller 2418. In such a configuration, SVC PID controller 2416 provides a coarser adjustment than PID drive controller 2418. In various other configurations, master controller 2412 controls drive PID controller 2418 to maintain a fixed output while SVC PID controller 2416 controls the duty cycle. Such a configuration may be implemented when the measured power differs from the power setpoint by a configurable threshold value. The optimal phase output value maintained when master controller 2412 directs drive PID controller 2418 to maintain phase value is selected for a predetermined efficiency of operation of the controlled power amplifier.

In various configurations, master controller 2412 includes one or a plurality of SVC PID controller 2416, drive PID controller 2418, and balancing module 2420. In various other configurations, balancing controller 2420 is omitted and SVC PID controller 2416 are controlled in accordance with the phase PID output by drive PID controller 2418 rather than forward power as determined by $P_{setpoint}$ and $P_{measure}$.

Figure 25:
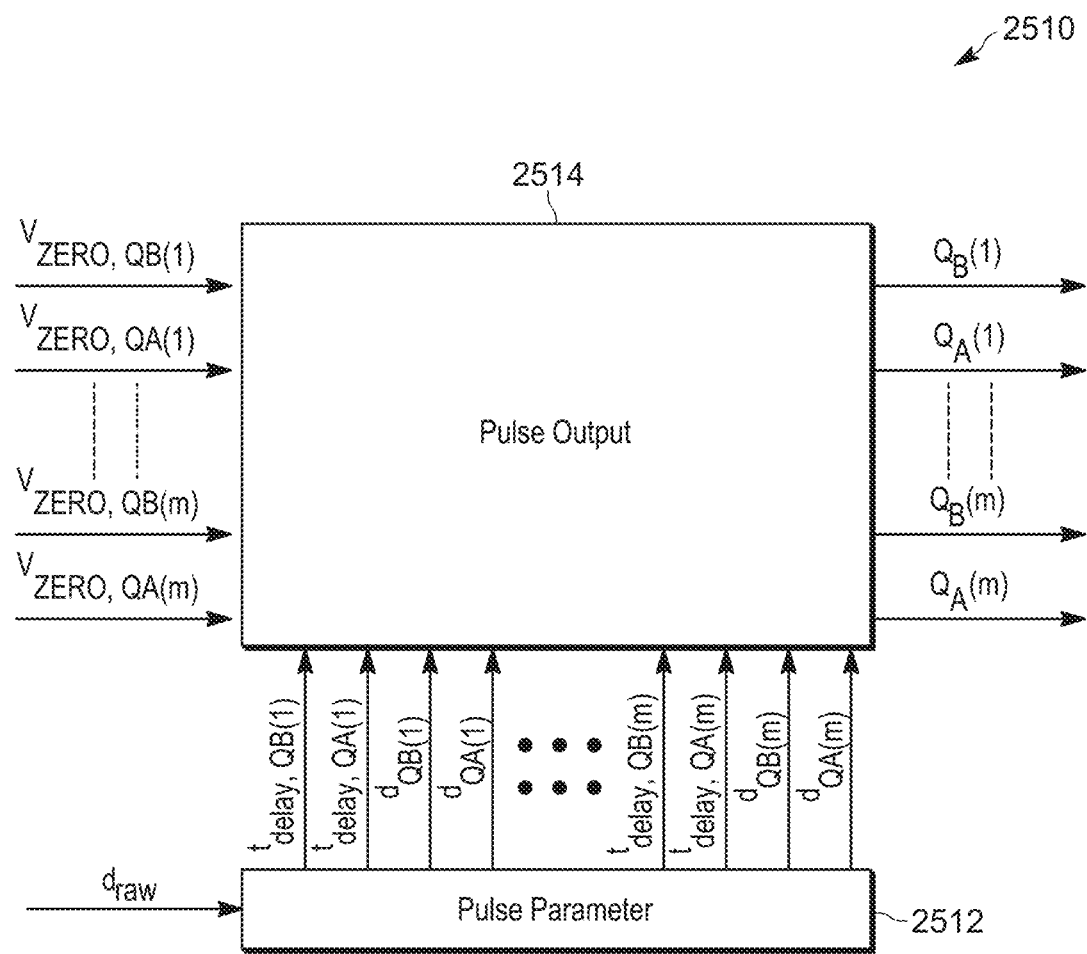
FIG. 25 shows a block diagram of a controller for a switched variable capacitor.

FIG. 25 shows a block diagram of SVC driver 2510, such as SVC driver 2116 of FIG. 21. SVC driver 2510 includes pulse parameter module 2512 and pulse output module 2514. Pulse parameter module 2512 receives the commanded duty cycle $d_{RAW}$ and generates a delay signal and a duty cycle or drive signal for controlling each of the switched pairs of a SVC module. That is, for each SVC module, pulse parameter module 2512 generates a delay $t_{delay,\ QA(1)}$, and a drive signal $d_{QA(1)}$, and $t_{delay,\ QB(1)}$, and a drive signal $d_{QB(1)}$. Pulse parameter module 2512 generates a delay and drive signal for each switch of the SVC modules in a SCM or power amplifier. The delay and the drive signals are input to pulse output module 2514. Pulse output module also receives zero cross information, such as from zero crossing detector 2130 of FIG. 21, for each SVC module. As described above, the zero crossing signal may be for one or both of a pair of switches in the SVC module. Pulse output module 2514 generates the drive signals for $Q_A$ and $Q_B$ for each of the SVCs.

Figure 26:
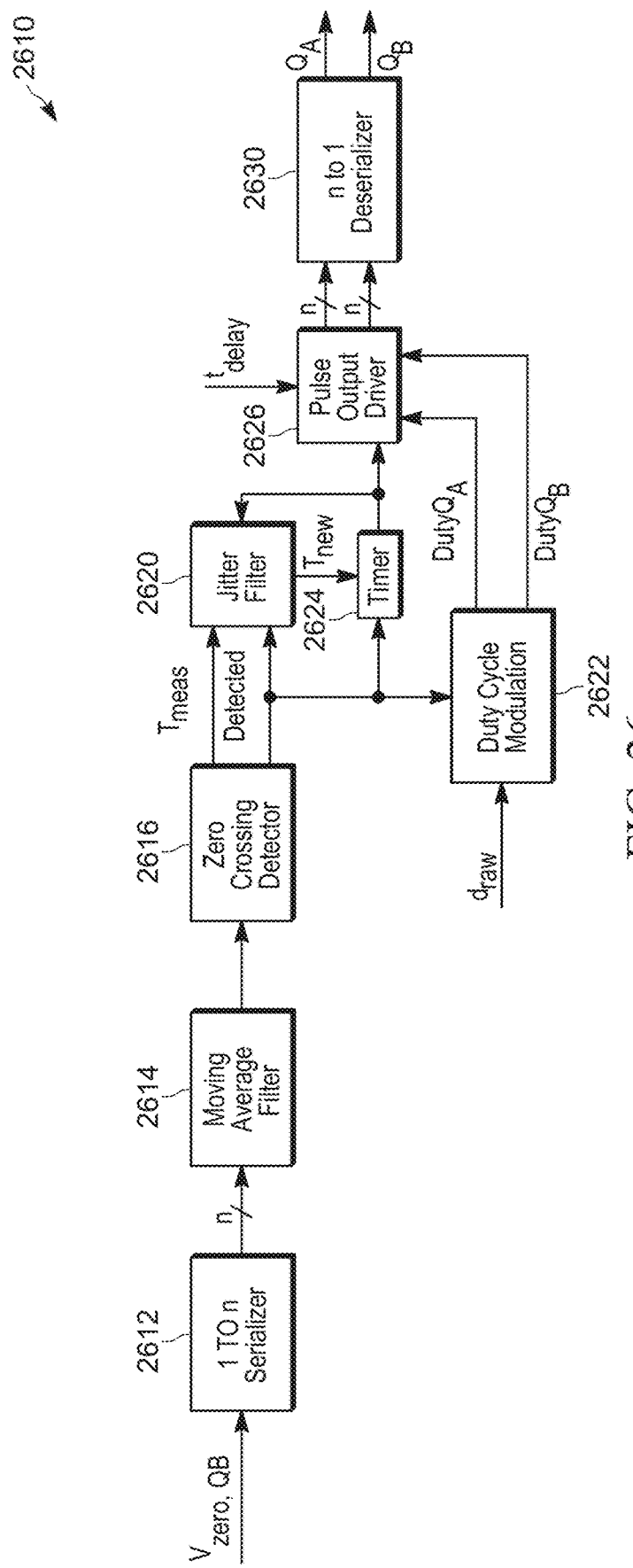
FIG. 26 shows an expanded block diagram of a controller for a switched variable capacitor, such as switched capacitor modulator of FIG. 25.

FIG. 26 shows a block diagram of a SVC driver module 2610, such as SVC driver module or SVC driver 2116 of FIG. 21. SVC driver 2610 is implemented using a serializer/deserializer to improve the input/output speed. By way of nonlimiting example, $V_{0, QB}$ may be sampled at one giga sample per second (GSPS), and serialized by a factor of four to reduce the processing rate to 250 MHz. In various configurations, SVC driver module 2610 is implemented in a field-programmable gate array (FPGA) at 250 MHz. Further by way of overview, SVC driver 2610 outputs gate drive signals $Q_A$ and $Q_B$ at 250 MHz, and deserializes the outputs back to the one GSPS.

Input $V_{zero}$, $Q_B$ is input to 1 to N serializer 2612, where N may be 4 in a nonlimiting example. The output from 1 to N serializer 2612 is input to moving average filter 2614 which filters noise out of the N input signals received. The output from moving average filter 2614 is input to zero crossing detector 2616 which compares the filtered data received from moving average filter 2614 to a threshold value to determine if a zero crossing has occurred. Zero crossing detector 2616 outputs a trigger signal Detected, indicating that a zero crossing has been detected, and a time signal $T_{meas}$, which is an estimated amount of time which has elapsed since a zero crossing detection. The two signals $T_{meas}$ and Detected are output to jitter filter 2620, and the Detected signal is also output to duty cycle modulation controller 2622. Jitter filter 2620 uses an existing T, which is the elapsed time since the previous jitter filter zero crossing detection and $T_{meas}$ to estimate a $T_{new}$. In various configurations, $T_{new}$ is the weighted average of T and $T_{meas}$. Jitter filter 2620 outputs the new elapsed time $T_{new}$ to timer 2624. Timer 2624 outputs T back to jitter filter 2620 and to pulse output driver 2626.

Returning to duty cycle modulation controller 2622, duty cycle modulation controller 2622 converts the command duty cycle setpoint $d_{RAW}$ into actual duty cycle signals for current pulse $DutyQ_A$ and $DutyQ_B$. Depending upon the value of the effective duty $d_{RAW}$, $DutyQ_A$ and $DutyQ_B$ change from pulse to pulse in a preconfigured pattern and are thus modulated. This enables outputting effective duty $d_{RAW}$ at a higher resolution. In various configurations, with an output of one gigabit per sample $Q_A$ and $Q_B$, the duty cycle can have a resolution of approximately one nanosecond. However, using modulation can provide an effective duty cycle of 125 picoseconds.

Returning to pulse output driver 2626, pulse output driver receives elapsed time T, duty signals duty $DutyQ_A$ and $DutyQ_B$, and delay $t_{delay}$, described above with respect to FIGS. 20 and 25. Pulse output driver outputs N pulses for $Q_A$ and N pulses for $Q_B$ to N to 1 deserializer 2630. N to 1 deserializer 2630 deserializes the N pulses into a single chain of pulses for each of $Q_A$ and $Q_B$.

In various configurations, effective duty cycle and, thus, power can also be controlled via pulse delay $t_{delay}$ referenced above in FIGS. 20, 25, and 26. Implementing the additional $t_{delay}$ control leverages the programmable precise delay features of FPGA 10 input/output pins. Thus, switches $Q_A$ and $Q_B$ of a switched variable impedance can be controlled in accordance with both the duty cycle and the delay.

In various configurations, FIG. 26 can be modified by removing one or both of jitter filter 2620 and duty cycle modulation controller 2622. In various other configurations, the input/output and SVC driver frequencies can be made the same and 1 to N serializer 2612 and N to 1 deserializer 2630 can be removed. In various other configurations, a phase lock loop can latch on a zero crossing signal and generate SVC control signals. In various other configurations, $V_{zero}$, $Q_B$ can be sampled on multiple pins with phase shifted clocks to improve resolution, and output module pairs $Q_A/Q_B$ can be driven by phase shifted clocks and combined into a simple pair of drive signals $Q_A/Q_B$. In other various configurations, VBA is sampled via an analog-to-digital converter and input to the FPGA.

Figure 27:
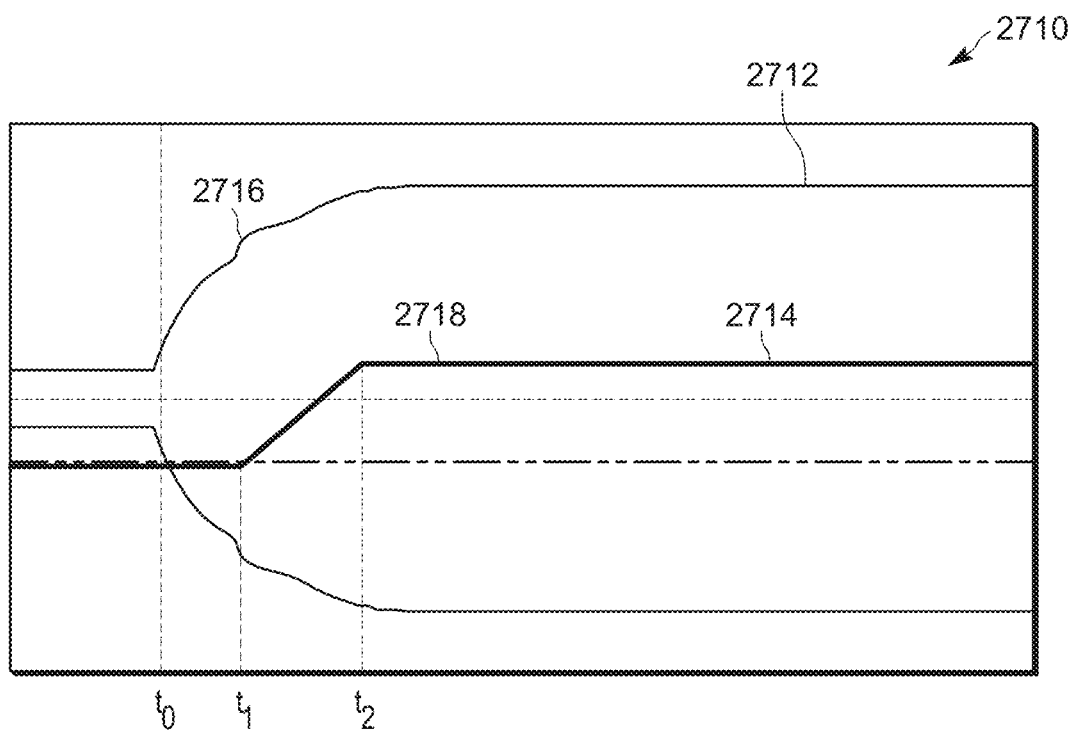
FIG. 27 shows waveforms describing operation of a power amplifier having a switched capacitor modulator operating in a continuous wave mode of operation.

FIG. 27 shows plots 2710 of a closed loop continuous-wave response to setpoint change from a first power to a higher power. In the particular example of FIG. 27, power is increased from 50 W to 3 kW, which is the maximum power of the power amplifier. FIG. 27 includes a waveform 2712 which indicates the envelope of the forward power output by the power amplifier. Waveform 2714 is an envelope indicating the duty cycle of the gate source voltage applied to one of the switches switched variable impedance. At to, the forward power starts to increase. Prior to $t_1$, the duty cycle is zero, and the switches of the switched variable impedance are maintained off. Following $t_1$, the duty cycle is increased to a duty cycle that yields a maximum forward power that occurs at $t_2$. As can be seen, forward power 2712 increases from $t_1$ to $t_2$ coincident with the increase in the duty cycle of the drive signal applied to the switches of the SVC. It should be noted that the waveforms of FIG. 27 are one nonlimiting example. The shapes of the forward power and duty cycle envelopes can vary depending on particular tunings.

Further referring to FIG. 27, before the SVC modulation module switches turn on, power amplifier drive starts to approach saturation. The output can be linearized to make the slope change during drive control. When the SVC turns on, it turns on at a minimum duty cycle. The switched capacitor module can engage at lower power to make the bump 2716 less pronounced. Further, the drive output can be adjusted when the SVC turns on via feedforward control. With reference to FIGS. 14 and 15, by way of nonlimiting example, the flat portion 2718 of the duty cycle waveform can indicate a duty cycle of approximately 0.34.

Figure 28:
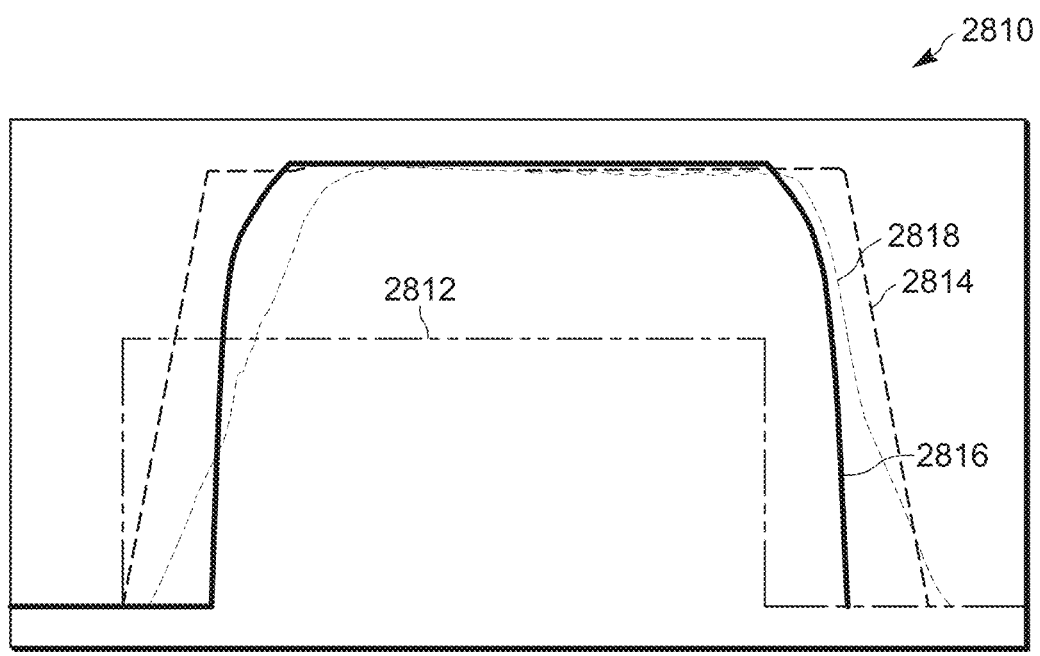
FIG. 28 shows waveforms for a power amplifier having a switched capacitor modulator operating in a pulse mode of operation.

FIG. 28 shows waveforms 2810 which indicate operation of a power amplifier in a pulse mode of operation. In the nonlimiting example of FIG. 28, the waveforms indicate adjusting the output power of a generator from 5 W to 3 kW at a 5 KHz pulse frequency and a VSWR of one. Waveforms 2810 include a forward power pulse waveform 2812, a drive setpoint 2814, a SCM setpoint 2816, and the forward power 2818 resulting from the pulsed, SCM control. As can be seen in FIG. 28, upon initiation of a pulse 2812, drive setpoint 2814 ramps up, and forward power 2814 increases. As forward power increases, SCM setpoint 2816 increases, indicating the above-described delay in SCM control. Following transition of pulse 2812 to zero SCM setpoint 2816 ramps down, which causes forward power 2818 to drop. Drive setpoint 2814 then ramps down, causing forward power 2814 to fall to zero.

The SCM or power amplifier described above is applicable to both low and high frequency generators. Typical low frequency generators operate at between 110 KHz to 2 MHz, and the typical high frequency RF generators operate at 13.56 or 27.12 MHz. Other frequency ranges for both low frequency RF generators and high frequency generators are also considered.

The benefits of the power amplifiers described above include reducing overall product size by removing the DC-DC power converters. In various configurations, RF generators can repurpose space vacated by the omitted DC-DC power converters by adding additional power amplifiers to provide significantly higher RF output powers for similarly sized generators without DC-DC power converters. In various nonlimiting examples, size reductions can range from 30% to 50%. Further, the omission of DC-DC power converters can result in significant product cost savings for a RF generator having the same output power and additional further cost savings for RF generators significantly increasing the power using additional RF amplifiers to fill the space vacated by the removed DC-DC power converters.

Further, the RF generators describe herein enable significantly faster response times to control the power, including response times in the microsecond range.

Figure 29:
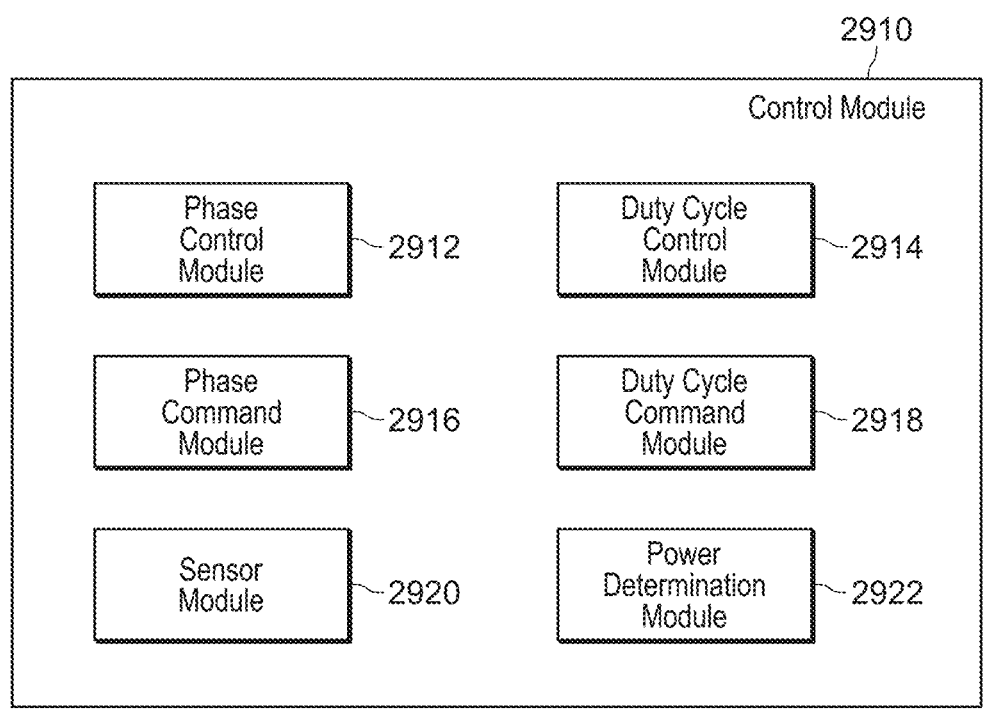
FIG. 29 shows a functional block diagram of an example control module arranged in accordance with various embodiments.

FIG. 29 incorporates various components of FIGS. 18, 19, and 21-26. Control module 2910 may include phase control module 2912, duty cycle control module 2914, phase command module 2916, duty cycle command module 2918, sensor module 2920, and power determination module 2922. In various configurations, control module 2910 includes one or a plurality of processors that execute code associated with the module sections or modules 2910, 2912, 2914, 2916, 2918, 2920, and 2922. Operation of the module sections or modules 2910, 2912, 2914, 2916, 2918, 2920, and 2922 is described below with respect to the method of FIG. 30.

For further defined structure of controllers any or all of FIGS. 1, 18, 19, and 21-26, see the below provided flow chart of FIG. 30 and the below provided definition for the term "module". The systems disclosed herein may be operated using numerous methods, examples, and various control system methods of which are illustrated any, all, or some combination of the figures above. Although the following operations are primarily described with respect to the implementations of any or all of FIGS. 1, 18, 19, and 21-26, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 30:
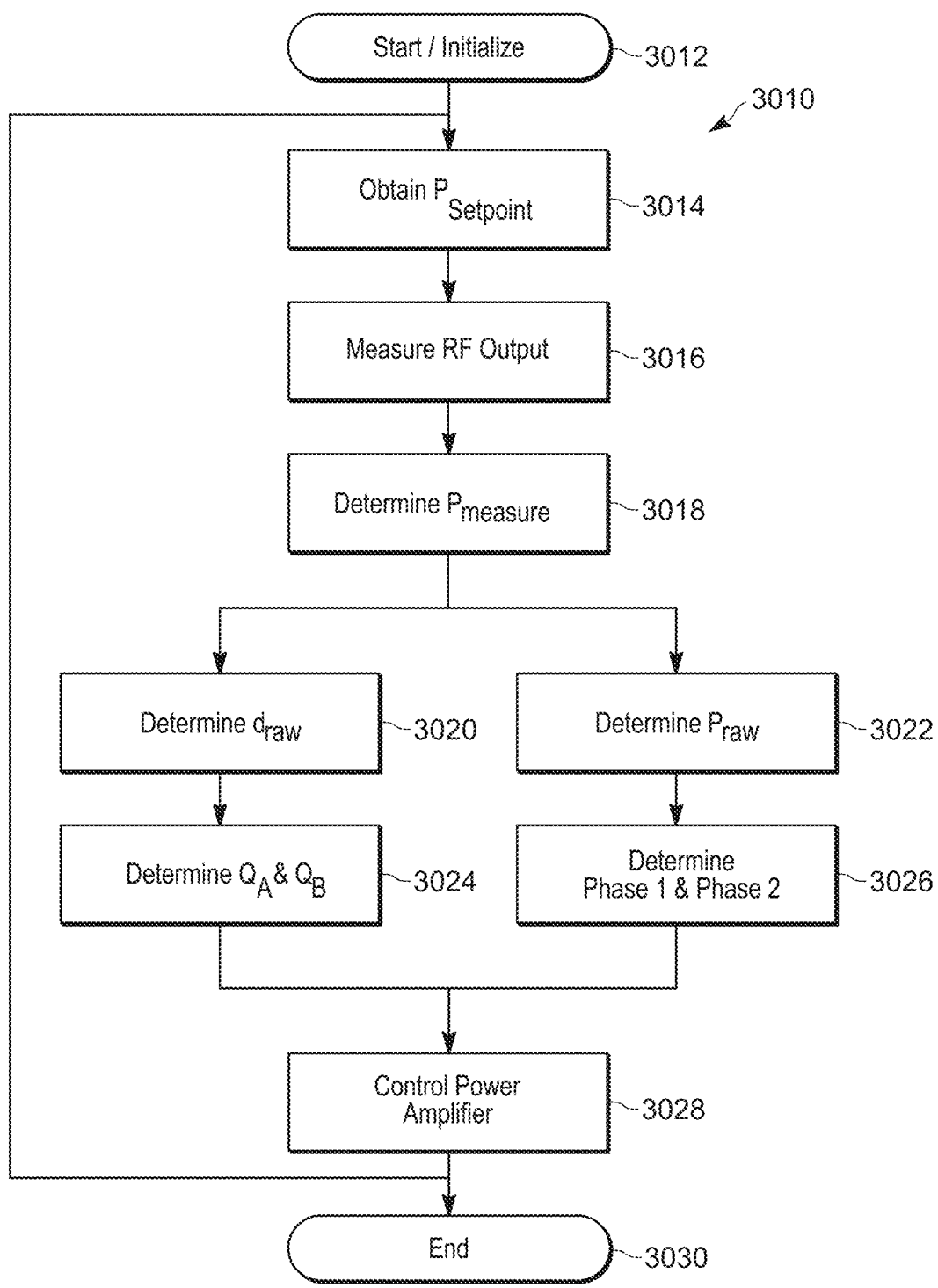
FIG. 30 shows a flow chart of operation of a control system arranged in accordance with the principals of the present disclosure.

FIG. 30 shows a flow chart of a control system 3010 for performing mode-based impedance control for, for example, the power delivery systems of FIGS. 1, 18, 19, and 21-26. Control begins at block 3012 and proceeds to block 3014 in which the controller determines the power setpoint $P_{setpoint}$. Control proceeds to block 3016 which measures the RF output using a sensor as described above. Control then proceeds to block 3018 were the measured power $P_{measure}$ is determined. Based on at least the power setpoint $P_{setpoint}$ and the measured power $P_{measure}$, one or both of a raw duty cycle $d_{raw}$ and brought phase $P_{raw}$ are determined at respective blocks 3020, 3022. Blocks 3020, 3022 may be executed in parallel or serially. From block 3020, control proceeds to block 3024 which determines the gate drive signals $Q_A$ and $Q_B$ of at least one SVC. From block 3022, control proceeds to block 3026 which determines the Phase1 and Phase2 signals for at least one power amplifier. Signals $Q_A$ and $Q_B$ and signals Phase1 and Phase2 are input to 3028 and are applied to the one or multiple power amplifiers to control the power and frequency output thereby. Control returns to block 3014 which repeats the process. The process terminates at block 3028.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set. The term "non-empty set" may be used to indicate exclusion of the empty set. The term "subset" does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A control circuit for a switched capacitor modulator (SCM) comprising:
   a RF power source configured to receive a DC voltage and a RF drive signal and to modulate an input signal in accordance with the DC voltage to generate a RF output signal to an output terminal; and
   a capacitance in parallel with the output terminal, the capacitance configured to vary in accordance with a capacitor control signal to vary an equivalent capacitance at the output terminal,
wherein the capacitor control signal varies a voltage applied to at least one terminal of a capacitor providing the capacitance.

2. The control circuit for the SCM of claim 1 wherein the RF drive signal determines a frequency and power of the RF output signal.

3. The control circuit for the SCM of claim 2 wherein the RF power source includes a plurality of RF power sources and the RF drive signal includes a plurality of RF drive signals.

4. The control circuit for the SCM of claim 3 wherein the plurality of RF power sources are configured to operate at a phase in order to vary a magnitude of the RF output signal.

5. The control circuit for the SCM of claim 4 wherein the RF output signal has a power that varies in accordance with the phase and the equivalent capacitance.

6. The control circuit for the SCM of claim 5 further comprising a controller configured to generate a commanded duty cycle and a commanded phase in accordance with a setpoint of a selected parameter and a measurement of the selected parameter.

7. The control circuit for the SCM of claim 6 wherein the controller further comprises a SVC controller configured to generate the commanded duty cycle in accordance with a difference between a power setpoint and a measured power.

8. The control circuit for the SCM of claim 6 wherein the capacitance is configured to receive voltages from a pair of switches including a first switch connected to a first terminal of the capacitance to apply a first voltage thereto and a second switch connected to a second terminal of the capacitance to apply a second voltage thereto, the first voltage and the second voltage varying to control the equivalent capacitance.

9. The control circuit for the SCM of claim 8 further comprising a SVC driver configured to generate control signals to actuate the pair of switches in accordance with the commanded duty cycle.

10. The control circuit for the SCM of claim 9 further comprising a drive PID configured to generate the commanded phase in accordance with a difference between a power setpoint and a measured power.

11. The control circuit for the SCM of claim 10 further comprising a direct digital synthesizer (DDS) configured to generate the plurality of RF drive signals in accordance with the commanded phase.

12. The control circuit for the SCM of claim 8 further comprising a drive controller configured to generate the commanded phase in accordance with a difference between a power setpoint and a measured power.

13. The control circuit for the SCM of claim 12 further comprising a direct digital synthesizer (DDS) configured to generate the plurality of RF drive signals in accordance with the commanded phase.

14. The control circuit for the SCM of claim 12 further comprising a SVC driver configured to generate control signals to actuate the pair of switches in accordance with the commanded duty cycle.

15. The control circuit for the SCM of claim 14 wherein the plurality of RF drive signals is selected so that the plurality of power sources operates at a selected phase.

16. The control circuit for the SCM of claim 1 wherein the capacitance is configured to receive voltages from a pair of switches including a first switch connected to a first terminal of the capacitance to apply a first voltage thereto and a second switch connected to a second terminal of the capacitance to apply a second voltage thereto, the first voltage and the second voltage varying to control the equivalent capacitance.

17. The control circuit for the SCM of claim 16 wherein the first voltage applied to the first terminal and the second voltage applied to the second terminal vary the equivalent capacitance.

18. The control circuit for the SCM of claim 16 wherein the pair of switches are operated a selected duty cycle, and the selected duty cycle determines the equivalent capacitance.

19. The control circuit for the SCM of claim 18 wherein the selected duty cycle is less than or equal to 0.4.

20. The control circuit for the SCM of claim 16 further comprising a first zero crossing detector to detect a first zero voltage crossing of one of the first voltage at the first terminal or the second voltage at the second terminal and wherein the pair of switches is operated in accordance with the first zero voltage crossing.

21. The control circuit for the SCM of claim 20 further comprising a second zero crossing detector to detect a second zero voltage crossing of an other of the first voltage at the first terminal or the second voltage at the second terminal and wherein one the pair of switches is operated in accordance with the first zero voltage crossing and the other of the pair of switches is operated in accordance the second zero voltage crossing.

22. The control circuit for the SCM of claim 21 wherein at least one of the pair of switches is activated relative to the first zero voltage crossing to effect a zero voltage switching of the at least one of the pair of switches.

23. The control circuit for the SCM of claim 21 wherein an other of the at least one of the pair of switches is activated relative to the first zero voltage crossing to effect a zero voltage switching of the other of the at least one of the pair of switches.

24. The control circuit for the SCM of claim 23 wherein an other of the at least one of the pair of switches is activated relative to a second zero voltage crossing to effect a zero voltage switching of the other of the at least one of the pair of switches.

25. The control circuit for the SCM of claim 23 further comprising one of a boost converter or a buck converter to respectively increase or decrease the DC voltage prior to output to the RF power source.

26. A control circuit for a switched capacitor modulator (SCM) comprising:
a plurality of RF power sources configured to receive a DC voltage and a plurality of respective RF drive signals and to modulate a respective plurality of inputs signal in accordance with the DC voltage to generate a RF output signal including the plurality of RF drive signals to an output terminal; and
a capacitance in parallel with the output terminal, the capacitance configured to vary in accordance with a capacitor control signal to vary an equivalent capacitance at the output terminal,
wherein the capacitor control signal varies a voltage applied to at least one terminal of a capacitor providing the capacitance.

27. The control circuit for the SCM of claim 26 wherein the plurality of RF power sources is configured to operate at a phase in order to vary a magnitude of the RF output signal.

28. The control circuit for the SCM of claim 27 further comprising a controller configured to generate a commanded duty cycle and a commanded phase in accordance with a setpoint of a selected parameter and a measurement of the selected parameter.

29. A control circuit for a switched capacitor modulator (SCM) comprising:
- a RF power source configured to receive a DC voltage and a RF drive signal and to modulate an input signal in accordance with the DC voltage to generate a RF output signal to an output terminal; and
- a capacitance in parallel with the output terminal, the capacitance configured to vary in accordance with a capacitor control signal to vary an equivalent capacitance at the output terminal,
- wherein the capacitance includes a capacitor having a first terminal and a second terminal configured to receive voltages from a respective pair of switches including a first switch connected to the first terminal of the capacitor to apply a first voltage thereto and a second switch connected to the second terminal of the capacitor to apply a second voltage thereto, and
- wherein the first voltage applied to the first terminal and the second voltage applied to the second terminal vary the equivalent capacitance.

30. The control circuit for the SCM of claim 29 wherein the pair of switches are operated a selected duty cycle, and the selected duty cycle determines the equivalent capacitance.

* * * * *